US009351399B2

(12) United States Patent
Ooyabu et al.

(10) Patent No.: US 9,351,399 B2
(45) Date of Patent: May 24, 2016

(54) LIGHT-EMITTING DEVICE, LIGHT-EMITTING DEVICE ASSEMBLY, AND ELECTRODE-BEARING SUBSTRATE IN WHICH A FRAGILE REGION IS FORMED IN A SUBSTRATE, AND LIGHT EMITTING DEVICE CUT FROM LIGHT-EMITTING DEVICE ASSEMBLY

(71) Applicant: NITTO DENKO CORPORATION, Ibaraki-shi, Osaka (JP)

(72) Inventors: Yasunari Ooyabu, Osaka (JP); Yoshihiko Kitayama, Osaka (JP); Munehisa Mitani, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/096,626

(22) Filed: Dec. 4, 2013

(65) Prior Publication Data
US 2014/0159072 A1 Jun. 12, 2014

(30) Foreign Application Priority Data

Dec. 10, 2012 (JP) .................................. 2012-269389
May 23, 2013 (JP) .................................. 2013-109034

(51) Int. Cl.
H01L 25/075 (2006.01)
H05K 1/11 (2006.01)
H01L 23/00 (2006.01)
H01L 33/52 (2010.01)
H01L 33/62 (2010.01)

(52) U.S. Cl.
CPC *H05K 1/11* (2013.01); *H01L 24/97* (2013.01); *H01L 25/0753* (2013.01); *H01L 33/52* (2013.01); *H01L 33/62* (2013.01); *H01L 2224/48091* (2013.01); *H01L 2224/48137* (2013.01); *H01L 2924/12041* (2013.01); *H01L 2924/12042* (2013.01); *H01L 2924/15787* (2013.01); *H01L 2924/181* (2013.01)

(58) Field of Classification Search
None
See application file for complete search history.

(56) References Cited

U.S. PATENT DOCUMENTS

2006/0071318 A1  4/2006  Yamamura
2008/0224608 A1  9/2008  Konishi et al.
2010/0213487 A1  8/2010  Kuo et al.
2010/0327295 A1  12/2010  Peng et al.

(Continued)

FOREIGN PATENT DOCUMENTS

EP  2 267 804 A2  12/2010
JP  2008-227412 A  9/2008

OTHER PUBLICATIONS

Extended European Search Report dated Jan. 30, 2014, issued by the European Patent Office in corresponding Application No. 13195460.4.

Primary Examiner — Michael Jung
(74) Attorney, Agent, or Firm — Sughrue Mion, PLLC

(57) ABSTRACT

A light-emitting device assembly includes a plurality of light-emitting devices, the plurality of light-emitting devices being provided continuously, the plurality of light-emitting devices each including a substrate, an optical semiconductor element mounted on the surface of the substrate, an encapsulating layer formed on the substrate surface to encapsulate the optical semiconductor element, and an electrode formed on the substrate surface so as to be electrically connected to the optical semiconductor element. The substrate has a fragile region formed to partition off the light-emitting devices that are disposed next to each other.

3 Claims, 13 Drawing Sheets

(56) References Cited

U.S. PATENT DOCUMENTS

| | | |
|---|---|---|
| 2011/0044029 A1 | 2/2011 | Konishi et al. |
| 2011/0186900 A1* | 8/2011 | Watari et al. ............... 257/99 |
| 2013/0181250 A1 | 7/2013 | Konishi et al. |
| 2013/0256711 A1* | 10/2013 | Joo et al. ............... 257/88 |
| 2014/0014980 A1* | 1/2014 | Morimoto ............ H01L 33/501 257/88 |
| 2014/0203304 A1* | 7/2014 | Kim ............... B29C 45/14639 257/88 |

* cited by examiner

Fig.3
Fig.3 (a)
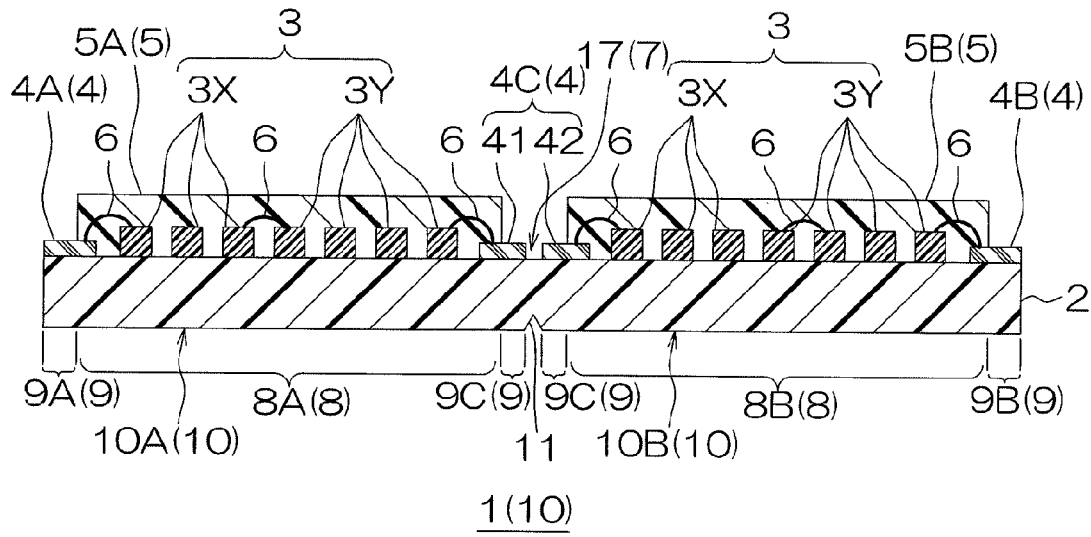
Fig.3 (b)
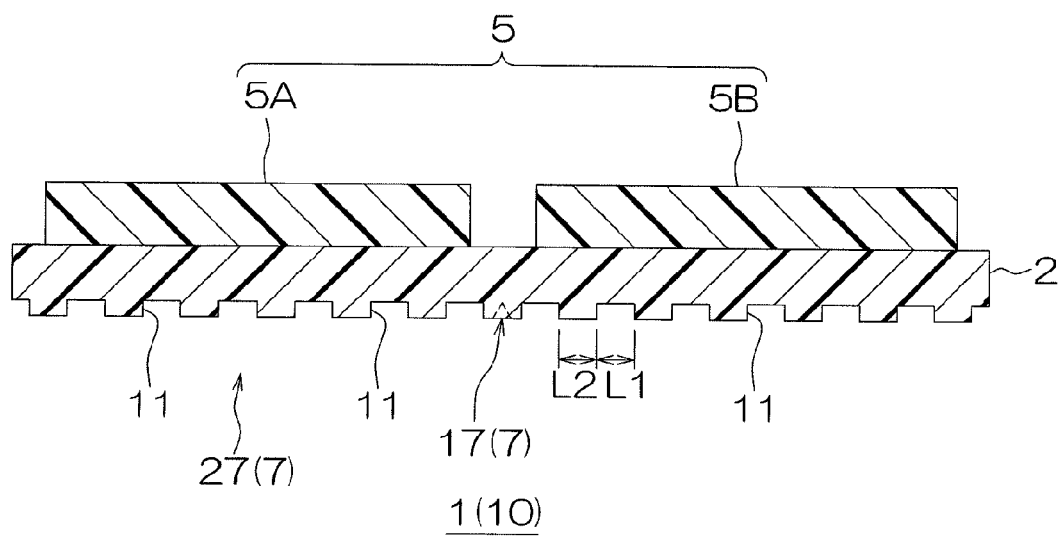
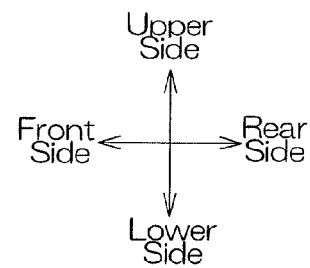

Fig.4
Fig.4 (a)
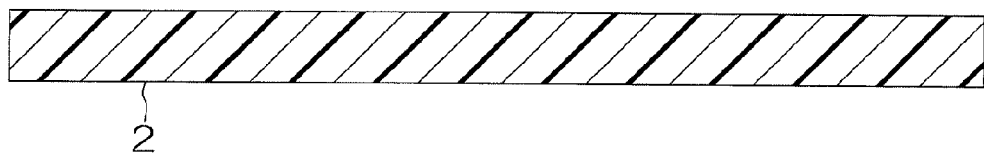
Fig.4 (b)
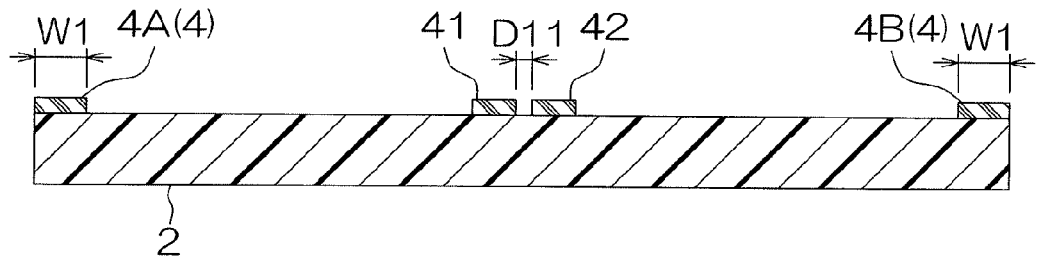
Fig.4 (c)
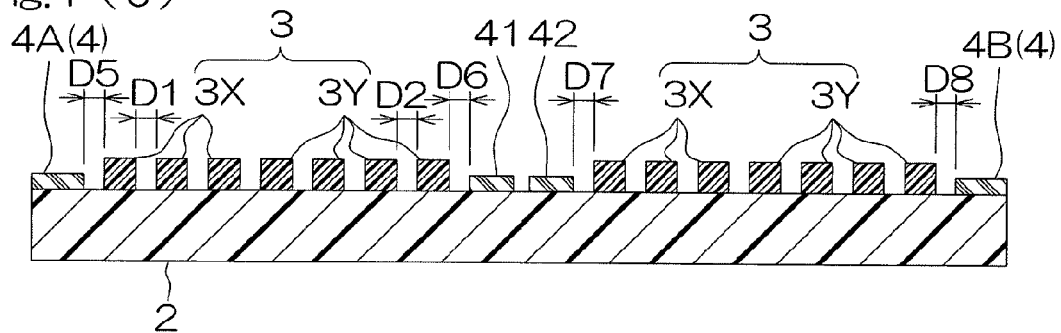
Fig.4 (d)
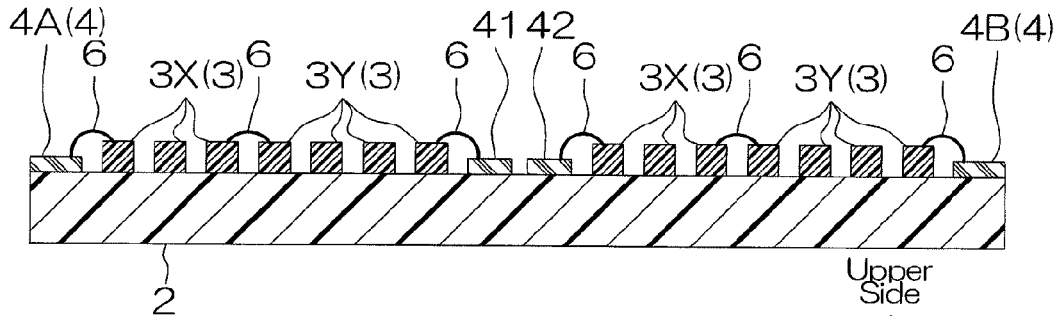

Fig.5
Fig.5 (e)
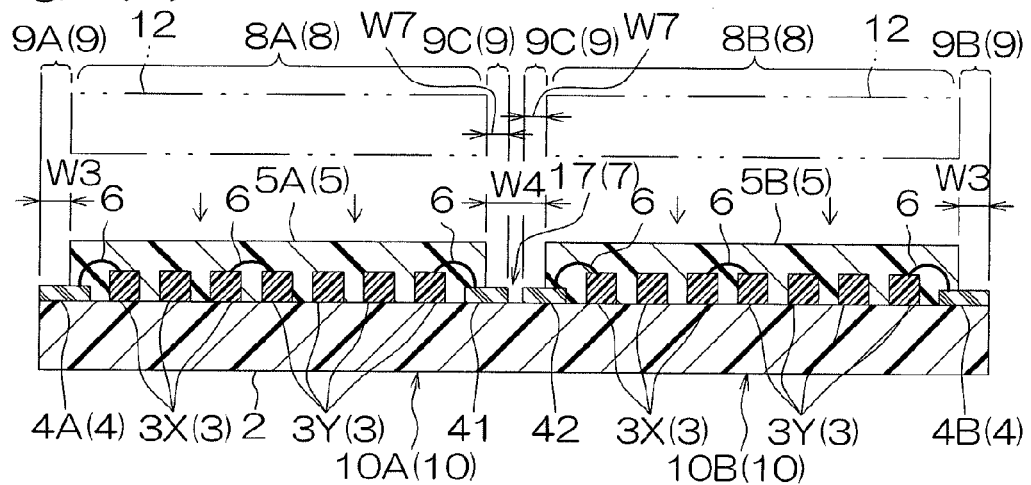
Fig.5 (f)
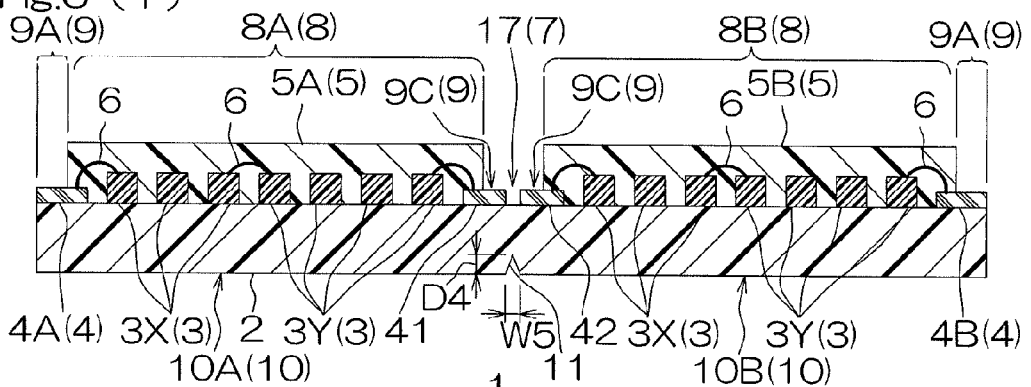
Fig.5 (g)
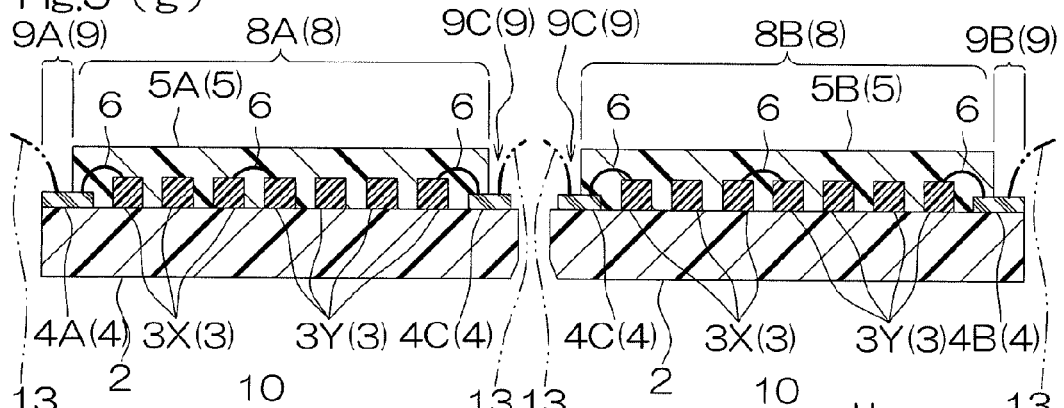
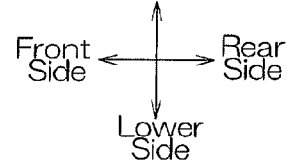

Fig.11
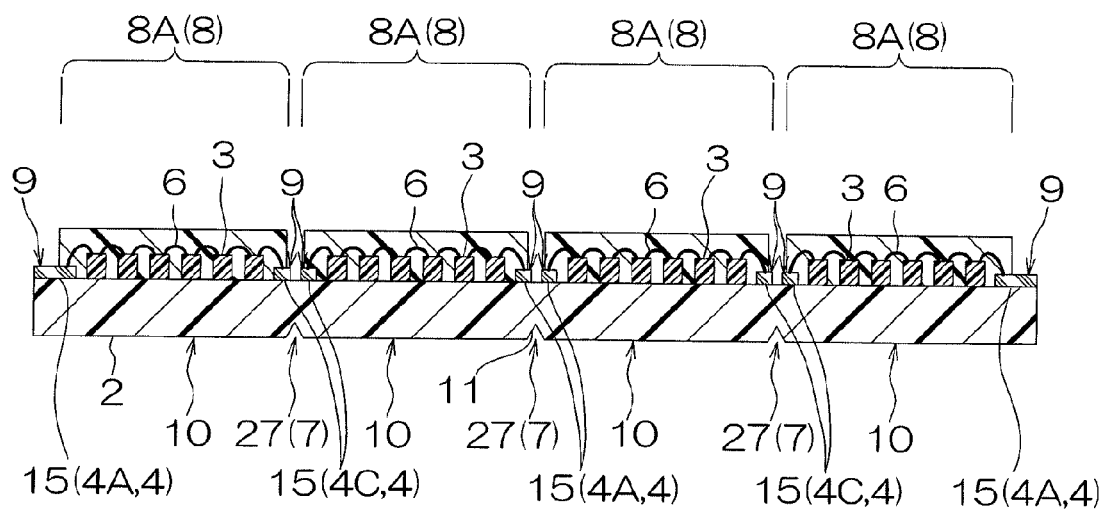
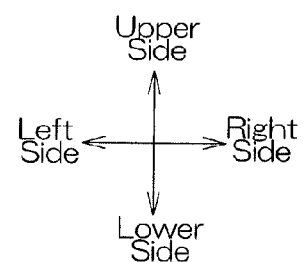

Fig.12
Fig.12 (a)
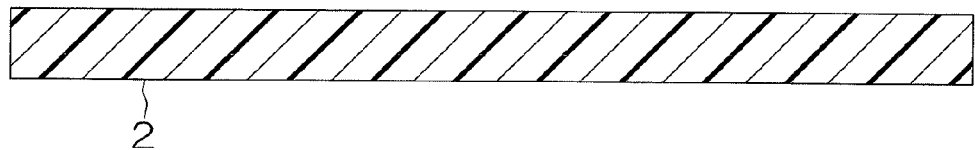
Fig.12 (b)
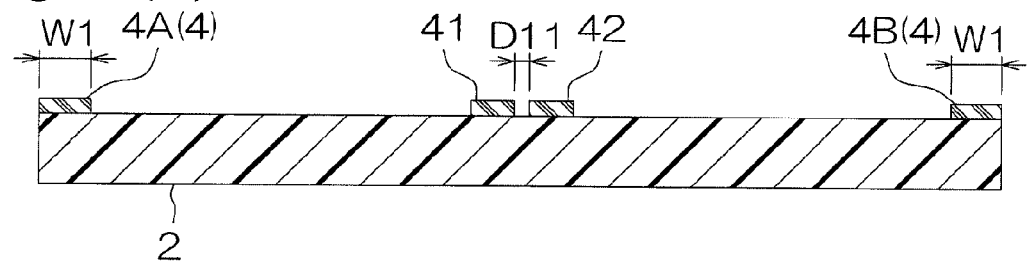
Fig.12 (c)
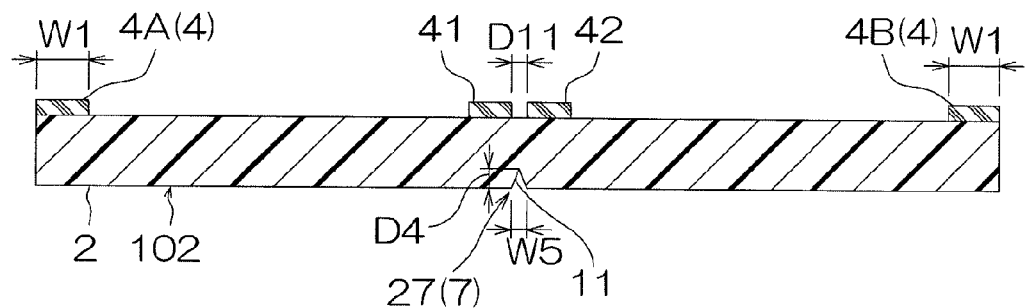
Fig.12 (d)
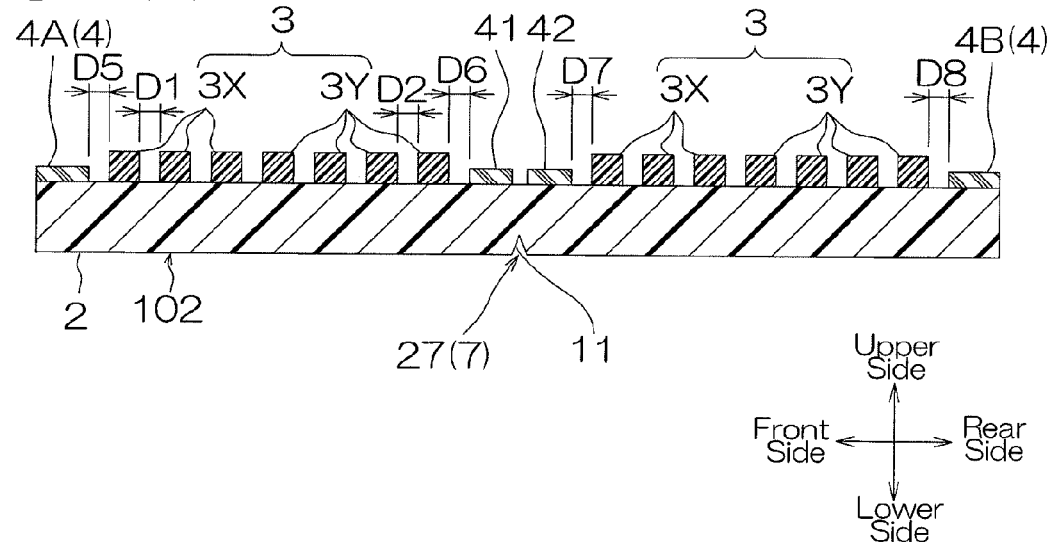

LIGHT-EMITTING DEVICE, LIGHT-EMITTING DEVICE ASSEMBLY, AND ELECTRODE-BEARING SUBSTRATE IN WHICH A FRAGILE REGION IS FORMED IN A SUBSTRATE, AND LIGHT EMITTING DEVICE CUT FROM LIGHT-EMITTING DEVICE ASSEMBLY

CROSS-REFERENCE TO RELATED APPLICATION

The present application claims priority from Japanese Patent Application No. 2012-269389 filed on Dec. 10, 2012, and Japanese Patent Application No. 2013-109034 filed on May 23, 2013, the contents of which are hereby incorporated by reference into this application.

BACKGROUND OF THE INVENTION

1. Field of the Invention

The present invention relates to a light-emitting device, a light-emitting device assembly, and an electrode-bearing substrate. In particular, the present invention relates to a light-emitting device, a light-emitting device assembly including a plurality of light-emitting devices, and an electrode-bearing substrate for production thereof.

2. Description of Related Art

Light-emitting devices are known to include a substrate, a light-emitting diode (LED) element mounted thereon, an encapsulating layer for encapsulating the LED element, and an electrode provided on the substrate to be connected to the LED for connection between a power source and the LED.

For example, Japanese Unexamined Patent Publication No. 2008-227412 has proposed a light-emitting device including an insulating substrate; a light-emitting element mounted on the center portion thereof an encapsulator formed on the insulating substrate to encapsulate so as to include the light-emitting element; and a positive electrode external connection land and a negative electrode external connection land that are disposed on the insulating substrate at the outside of the encapsulator in spaced-apart relation.

SUMMARY OF THE INVENTION

However, the light-emitting device described in Japanese Unexamined Patent Publication No. 2008-227412 is obtained by singulation of an assembly having a plurality of light-emitting devices by, for example, dicing, and in view of reduction in production costs or number of processes, a more simple production of the individually separated light-emitting devices is demanded.

An object of the present invention is to provide an electrode-bearing substrate that allows for easy production of a light-emitting device; a light-emitting device assembly; and a light-emitting device that are obtained from the light-emitting device assembly.

A light-emitting device assembly of the present invention includes a plurality of light-emitting devices, the plurality of light-emitting devices being provided continuously, the plurality of light-emitting devices each including a substrate, an optical semiconductor element mounted on the surface of the substrate, an encapsulating layer formed on the substrate surface to encapsulate the optical semiconductor element, and an electrode formed on the substrate surface so as to be electrically connected to the optical semiconductor element, wherein the substrate has a fragile region formed to partition off the light-emitting devices that are disposed next to each other.

In the light-emitting device assembly, the substrate has a fragile region formed thereon, and therefore by cutting the substrate of the light-emitting device assembly along the fragile region, a plurality of light-emitting devices can be obtained easily.

In the light-emitting device assembly of the present invention, it is preferable that the substrate is further formed with an encapsulating region in which the optical semiconductor element is included and which is defined by the encapsulating layer, and an electrode region defined by the electrode exposed from the encapsulating layer; wherein only the fragile region, the encapsulating region, and the electrode region are formed on the substrate.

In the light-emitting device assembly, only the fragile region, the encapsulating region, and the electrode region are formed on the substrate. That is, on the entire region other than the fragile region and the encapsulating region of the substrate, the electrode region is formed, and therefore because of excellent thermal conductivity of the electrode region, heat-releasing characteristics of the light-emitting device assembly can be improved. Furthermore, the region other than the fragile region and the encapsulating region of the substrate is entirely the electrode region, and therefore because of a relatively large electrode region, wires can be easily and reliably connected to the electrode region.

Thus, the light-emitting device assembly is excellent in both heat-releasing characteristics and connectivity to wires.

The light-emitting device assembly can be a small size.

In the light-emitting device assembly of the present invention, it is preferable that the fragile region is formed with cuts.

With the light-emitting device assembly, the fragile region is formed with cuts, and therefore further reduction in the strength of the fragile region can be ensured, and thus cutting of the substrate can be performed along the fragile region more easily and surely.

In the light-emitting device assembly of the present invention, it is preferable that the encapsulating layer encapsulates the light-emitting devices that are disposed next to each other with a spaced-apart region interposed therebetween, and the fragile region is formed in the spaced-apart region.

In the light-emitting device assembly, the fragile region is formed in the spaced-apart regions, and therefore by cutting the substrate along the fragile region, the light-emitting device can be obtained surely and efficiently.

In the light-emitting device assembly of the present invention, it is preferable that the encapsulating layer includes a continuous region that allows for continuous encapsulation of the light-emitting devices that are disposed next to each other, and the fragile region is formed so as to partition off the light-emitting devices that are disposed next to each other in the continuous region.

With the light-emitting device assembly, the light-emitting device can be obtained easily by cutting the substrate and the encapsulating layer along the fragile region in the continuous region that allows for continuous encapsulation of the light-emitting devices that are disposed next to each other. Thus, the light-emitting device can be obtained surely and efficiently.

A light-emitting device of the present invention is obtained by cutting a light-emitting device assembly, the light-emitting device assembly including a plurality of light-emitting devices, the plurality of light-emitting devices being provided continuously, the plurality of light-emitting devices each including a
  substrate, an optical semiconductor element mounted on
  the substrate surface, an encapsulating layer formed on
  the substrate surface so as to encapsulate the optical
  semiconductor element, and an electrode formed on the
  substrate surface to be electrically connected to the opti-
  cal semiconductor element,
wherein the substrate is formed with a fragile region that
  partitions off the light-emitting devices that are disposed
  next to each other, and
the light-emitting device assembly is cut along the fragile
  region to obtain the light-emitting device.

The light-emitting device is obtained by simple steps from the light-emitting device assembly.

An electrode-bearing substrate of the present invention includes a substrate formed with an element-mounting region for mounting an optical semiconductor element, and an encapsulating layer-forming region for forming an encapsulating layer formed to encapsulate the optical semiconductor element; and an electrode formed on the substrate surface so as to be electrically connected to the optical semiconductor element, wherein the electrode-bearing substrate is formed with a fragile region that partitions off each of a plurality of optical semiconductor devices corresponding to the optical semiconductor element and the encapsulating layer.

In the electrode-bearing substrate, the optical semiconductor element is mounted on the element-mounting region of the substrate, and the encapsulating layer is formed on the encapsulating layer-forming region so as to encapsulate the optical semiconductor element: thus, with the fragile region formed to partition off the plurality of optical semiconductor devices corresponding to the optical semiconductor element and the encapsulating layer, by cutting the electrode-bearing substrate along the fragile region, the plurality of light-emitting devices can be obtained.

With the light-emitting device assembly and the electrode-bearing substrate of the present invention, a plurality of light-emitting devices can be obtained easily.

A light-emitting device of the present invention is obtained from the light-emitting device assembly by simple steps.

BRIEF DESCRIPTION OF THE DRAWINGS

FIG. 3 shows enlarged cross-sectional views of the light-emitting device assembly shown in FIG. 2, FIG. 3 (a) illustrating a cross-sectional view along line A-A, and FIG. 3 (b) illustrating a cross-sectional view along line B-B.

FIG. 4 shows cross-sectional views illustrating a method for producing the light-emitting device assembly shown in FIG. 3, FIG. 4 (a) illustrating a step of preparing a substrate, FIG. 4 (b) illustrating a step of forming electrodes, FIG. 4 (c) illustrating a step of mounting optical semiconductor elements on the substrate, and FIG. 4 (d) illustrating a step of electrically connecting electrodes, and electrically connecting the electrodes and optical semiconductor elements by wires.

FIG. 5 shows, subsequent to FIG. 4, cross-sectional views illustrating the method for producing the light-emitting device assembly shown in FIG. 3, FIG. 5 (e) illustrating a step of encapsulating optical semiconductor elements and wires with an encapsulating layer, FIG. 5 (f) illustrating a step of forming cuts on the substrate, and FIG. 5 (g) illustrating a step of singulation of the light-emitting device assembly into light-emitting devices.

FIG. 11 shows an enlarged cross-sectional view along line D-D of the light-emitting device assembly shown in FIG. 10.

FIG. 12 shows cross-sectional views illustrating a method for producing a light-emitting device assembly of a fourth embodiment of the light-emitting device assembly of the present invention, FIG. 12 (a) illustrating a step of preparing a substrate, FIG. 12 (b) illustrating a step of forming electrodes, FIG. 12 (c) illustrating a step of forming cuts on the substrate to produce an electrode-bearing substrate, and FIG. 12 (d) illustrating a step of mounting optical semiconductor elements on the substrate.

DETAILED DESCRIPTION OF THE INVENTION

First Embodiment

Figure 1:
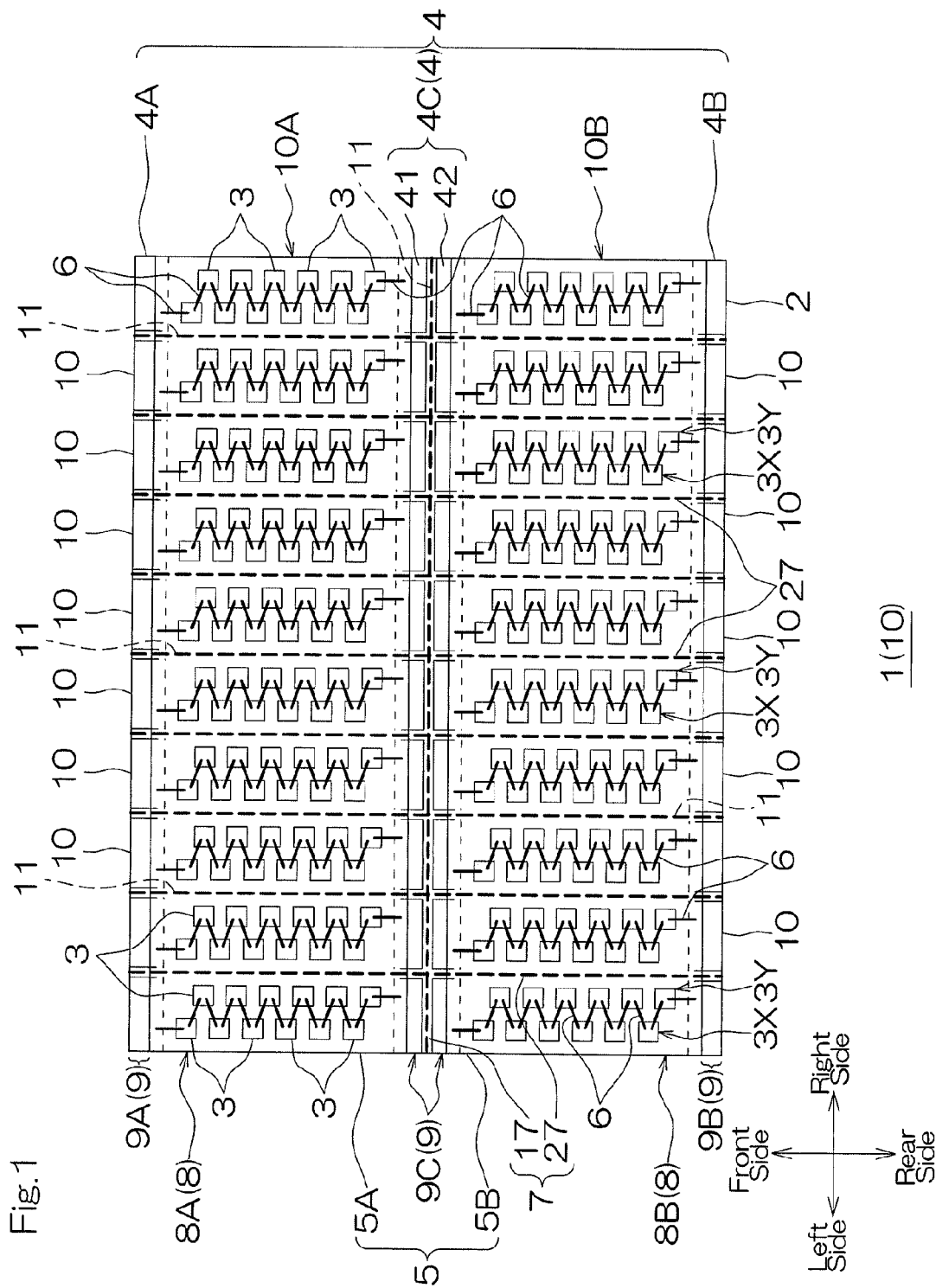
FIG. 1 shows a plan view of a first embodiment of the light-emitting device assembly of the present invention.

The directions in FIG. 1 are in conformity with the direction arrows in FIG. 1: the left-right directions in the plane of the paper are regarded as left-right directions (horizontal direction or first direction), up-down directions in the plane of the paper are regarded as front-rear directions (vertical direction, or second direction perpendicular to the first direction), and depth directions relative to the paper plane are regarded as up-down directions (thickness direction, or third direction perpendicular to both directions of the first direction and the second direction). The directions in FIG. 2 and the following figures are in conformity with the directions in FIG. 1. In FIG. 1, the LEDs 3 and the wires 6 to be described later are covered with the encapsulating layer 5 described later, and therefore they are not visible when viewed from the top: however, to clearly show the positions of the LEDs 3 and the wires 6 relative to the encapsulating layer 5 to be described later, they are shown with the solid line for convenience. Furthermore, in FIGS. 1 and 2, the cuts 11 to be described later are at the bottom side of the substrate 2, and therefore they are not visible when viewed from the top: however, to clearly show the positions relative to the LEDs 3 and the electrodes 4, they are shown with the bold broken line for convenience.

In FIG. 1, the light-emitting device assembly 1 extends in the front-rear directions and the left-right directions, has a generally rectangular shape when viewed from the top extending in the left-right directions, and is formed integrally from a plurality (e.g., 20) of light-emitting devices 10 provided continuously. In the light-emitting device assembly 1, the plurality of light-emitting devices 10 are arranged regularly in the left-right directions and the front-rear directions: to be specific, the plurality of light-emitting devices 10 are arranged in parallel to be next to each other, so that ten columns of the light-emitting devices 10 are arranged in the left-right directions, and two rows of the light-emitting devices 10 are arranged in the front-rear directions. Each of the light-emitting devices 10 is formed in a region that is generally rectangular shape when viewed from the top, with a fragile region 7 (described later) shown in the bold broken line as a border.

The light-emitting device assembly 1 includes, as shown in FIGS. 1 and 3, a substrate 2; LEDs 3 as optical semiconductor elements mounted on the upper face (surface) of the substrate 2; and electrodes 4 that are formed on the upper face (surface) of the substrate 2 so as to be electrically connected to the LEDs 3.

The substrate 2 is formed into a generally rectangular flat plate shape when viewed from the top having the same outline shape as that of the light-emitting device assembly 1 when viewed from the top.

The LED 3 is formed into a generally rectangular flat plate shape when viewed from the top, and the plurality of LEDs 3 are provided in the light-emitting device assembly 1. The LEDs 3 are disposed on the upper face of the substrate 2 so as to ensure the region for forming the electrodes 4 and the cuts 11 to be described next. That is, LEDs 3 are provided in a region other than the front-end portion, the center portion in the front-rear directions, and the rear-end portion in the substrate 2. That is, the LEDs 3 are provided on the upper face of the substrate 2, at a center portion in the front-rear directions in the front-half portion, and at a center portion in the front-rear directions in the rear-half portion.

Figure 2:
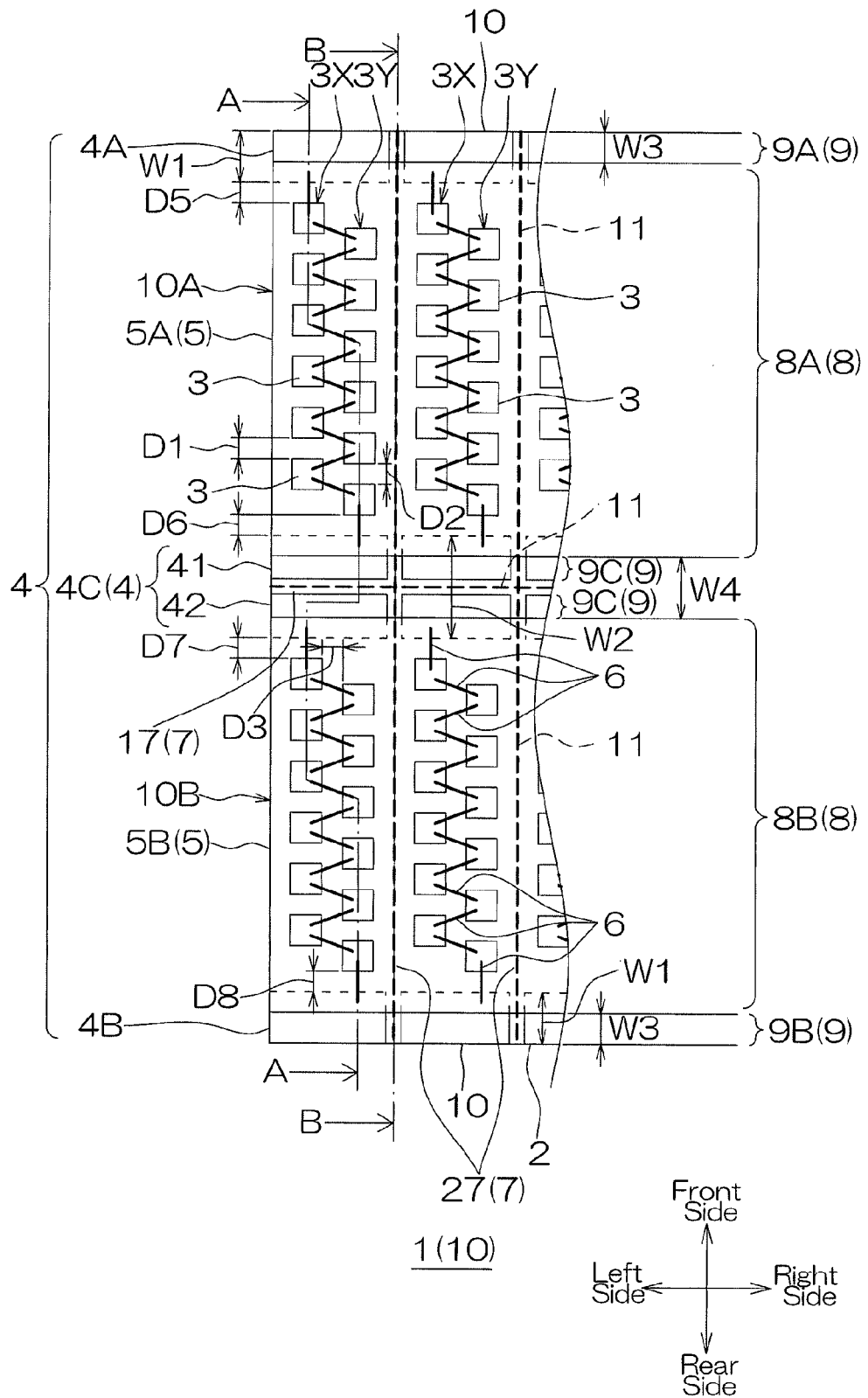
FIG. 2 shows an enlarged plan view of the light-emitting device assembly shown in FIG. 1.

The plurality of LEDs 3 are zigzag-arranged regularly on the upper face of the substrate 2 in the left-right directions and in the front-rear directions in spaced-apart relation to each other. To be specific, the LEDs 3 are provided, as shown in FIG. 2, in a plural number (e.g., 12) in each of the light-emitting devices 10. The LEDs 3 are provided in each of the light-emitting devices 10 in a plural number (e.g., 2 columns) in the left-right directions in spaced-apart relation to each other, and the LEDs 3 in each column are provided in a plural number (e.g., 6) in the front-rear directions in spaced-apart relation to each other. The LEDs 3X on the left column, and LEDs 3Y on the right column that are disposed on the right side relative to the LEDs 3X are disposed to be shifted in the front-rear directions when projected in the left-right directions. To be specific, the LEDs 3X in the left column are disposed to shift toward the front-side relative to the LEDs 3Y in the right column when projected in the left-right directions. In other words, the LEDs 3X in the left column are disposed on the left side obliquely frontward relative to the LEDs 3Y in the right column.

Furthermore, as shown in FIGS. 2 and 3, the light-emitting device assembly 1 includes wires 6 for electrically connecting the plurality of LEDs 3 in each of the light-emitting devices 10.

To be specific, the plurality (e.g., 12) of LEDs 3 in each of the light-emitting devices 10 are electrically connected in series with a plurality of (e.g., 11) wires 6. To be specific, in the light-emitting device 10, the wires 6 electrically connect the LEDs 3X in the left column and the LEDs 3Y in the right column one by one alternately, and in this manner, the arrangement in series made up of the LEDs 3 and the wires 6 is in a zigzag form in the front-rear directions. To be specific, at the front-side portion of each of the light-emitting devices 10, the foremost LED 3X of the left column, the wire 6, the foremost LED 3Y of the right column, the wire 6, and the LED 3X disposed at the rear-side of and next to the foremost LED 3X of the left column are electrically connected in series, and such connection is arranged repeatedly from the front-side toward the rear-side. Furthermore, at the rear-side portion of each of the light-emitting devices 10, the rearmost LED 3Y of the right column, the wire 6, the rearmost LED 3X of the left column, the wire 6, and LED 3Y disposed at the front-side of and next to the rearmost LED 3Y of the right column of the right column are electrically connected in series, and such connection is arranged repeatedly from the rear-side toward the front-side.

As shown in FIG. 1, a plurality of electrodes 4 each are formed into a generally rectangular shape extending in the left-right directions when viewed from the top (or generally straight line shape when viewed from the top) at each of the front-end portion, the center portion in the front-rear directions, and the rear-end portion of the substrate 2. In the light-emitting device assembly 1, each of the electrode 4A in the front-end portion, the electrode 4B in the rear-end portion, and the electrode 4C of the center portion in the front-rear directions is partitioned so as to be divided into a plurality (e.g., 10) of electrodes by vertical fragile regions 27 (described later) in the left-right directions. That is, in the light-emitting devices 10, the electrode 4A of the front-end portion, the electrode 4B of the rear-end portion, and the electrode 4C of the center portion in the front-rear directions are formed so as to be continuous in the left-right directions. Furthermore, as shown in FIG. 3 (a), the front-end face of the electrode 4A at the front-end portion and the front-end face of the substrate 2 are formed so that they are disposed at the same position when viewed from the top. That is, they are formed to be flush with each other. The rear-end face of the rear-end portion of the electrode 4B and the rear-end face of the substrate 2 are formed so that they are disposed at the same position when viewed from the top. That is, the rear-end face of the rear-end portion of the electrode 4B and the rear-end face of the substrate 2 are formed so that they are flush with each other. The electrode 4C of the center portion in the front-rear directions is configured from a front-side portion 41 included in the light-emitting device 10A of the front row, and a rear-side portion 42 included in the light-emitting device 10B of the rear row disposed at the rear-side to face the light-emitting device 10A of the front row in spaced-apart relation. These front-side portions 41 and the rear-side portions 42 are disposed in spaced-apart relation to each other in front-rear directions, and are partitioned in the front-rear directions (one direction) so as to be divided with a horizontal fragile region 17 (described later) as a border.

As shown in FIGS. 2 and 3, the electrodes 4 are electrically connected to the LEDs 3 through the wires 6. To be specific, in the light-emitting devices 10A in the front row, the electrode 4A at the front-end portion is electrically connected to the foremost LED 3X of the left column through the wire 6, and the front-side portion 41 of the electrode 4C at the center portion in the front-rear directions is electrically connected to the rearmost LED 3Y of the right column through the wire 6. Meanwhile, in the light-emitting device 10B of the rear row, the rear-side portion 42 of the electrode 4C at the center portion in the front-rear directions is electrically connected to the foremost LED 3X of the left column through the wire 6, and the electrode 4B at the rear-end portion is electrically connected to the rearmost LED 3Y of the right column through the wire 6.

The wires 6 are connected to the rear-end edge of the upper face of the electrode 4A at the front-end portion, and the wires 6 are connected to the front-end edge of the upper face of the electrode 4B at the rear-end portion. Furthermore, the wires 6 are connected to the front-end edge of the upper face of the front-side portion 41 of the electrode 4C at the center portion in the front-rear directions, and the wires 6 are connected to the rear-end edge of the upper face of the rear-side portion 42 of the electrode 4C at the center portion in the front-rear directions.

The light-emitting device assembly 1 includes an encapsulating layer 5.

The encapsulating layer 5 is formed on the substrate 2 so as to encapsulate the plurality of LEDs 3. To be specific, the encapsulating layer 5 is formed continuously on the upper face (surface) of both of the front-side portion and the rear-side portion of the substrate 2 so as to extend in the left-right directions (one direction).

To be specific, the encapsulating layer 5 is provided in a plural number (e.g., 2) in spaced-apart relation in the front-rear directions, and as shown in FIG. 1, each of the encapsulating layers 5 is formed continuously extending in the left-right directions (one direction).

To be specific, in the encapsulating layer 5, a front-side encapsulating layer 5A and a rear-side encapsulating layer 5B encapsulate the light-emitting device 10A of the front row and the light-emitting device 10B of the rear row that are disposed next to each other in the front-rear directions with a space (spaced-apart region) provided therebetween. Each of the front-side encapsulating layer 5A and the rear-side encapsulating layer 5B forms a continuous region that encapsulates the light-emitting devices 10 that are disposed next to each other in the left-right directions.

To be more specific, the front-side encapsulating layer 5A has a generally rectangular shape when viewed from the top extending continuously in the left-right directions, and is formed to cover each of the light-emitting devices 10A at the front row and the LEDs 3 and the wires 6 of the light-emitting devices 10 continuously. As shown in FIG. 3, the front-side encapsulating layer 5A is formed so as to cover the upper face and the side faces (front face, rear face, right side face, and left side face) of each of the LEDs 3 of the light-emitting device 10A at the front row, and at least the inner side face (that is, the rear-end face of the electrode 4A at the front-end portion, and the front-end face of the electrode 4C at the center portion in the front-rear directions shown in the thin broken line shown in FIG. 1 and FIG. 2) of the electrodes 4.

The front-side encapsulating layer 5A is formed to cover the rear-end edge of the upper face of the electrode 4A of the front-end portion, and to expose the front-end edge and the center portion in the front-rear directions of the upper face of the front-end portion electrode 4A. Furthermore, the front-side encapsulating layer 5A is formed to cover the front-end edge of the upper face of the front-side portion 41 of the electrode 4C at the center portion in the front-rear directions, and to expose the rear-end edge and the center portion in the front-rear directions of upper face of the front-side portion 41 of the electrode 4C at the center portion in the front-rear directions.

That is, as shown in FIGS. 2 and 3, the front-end face of the front-side encapsulating layer 5A is formed so as to extend in the left-right directions to overlap with the middle portion in the front-rear directions (slightly rear-side portion) of the electrode 4A of the front-end portion when projected in the thickness direction, and the rear-end face of the front-side encapsulating layer 5A is formed to extend in the left-right directions so as to overlap with the middle portion in the front-rear directions of the front-side portion 41 of the electrode 4C of the center portion in the front-rear directions when projected in the thickness direction.

In this manner, all of the LEDs 3 and all of the wires 6 are covered with the front-side encapsulating layer 5A in the light-emitting device 10A at the front row.

As shown in FIG. 1, the rear-side encapsulating layer 5B has a generally rectangular shape when viewed from the top extending continuously in the left-right directions, and is formed to continuously cover the light-emitting devices 10B of the rear row and the LEDs 3 and the wires 6 in each of the light-emitting device 10. As shown in FIG. 3, the rear-side encapsulating layer 5B is formed on the upper face and the side faces (front face, rear face, right side face, and left side face) of LEDs 3 of the light-emitting device 10B of the rear row, and on at least inner side face (that is, front-end face of the electrode 4B at the rear-end portion and rear-end face of the electrode 4C at the center portion in the front-rear directions as shown in the thin broken line of FIG. 1 and FIG. 2) of the electrode 4.

The rear-side encapsulating layer 5B is formed to cover the front-end edge of the upper face of the electrode 4B of the rear-end portion and to expose the rear-end edge and the center portion in the front-rear directions of the upper face of the electrode 4B at the rear-end portion. Furthermore, the rear-side encapsulating layer 5B is formed to cover the rear-end edge of the upper face of rear-side portion 42 of the electrode 4C of the center portion in the front-rear directions, and to expose the front-end edge and the center portion in the front-rear directions of the upper face and at the center portion in the front-rear directions of the rear-side portion 42 of the electrode 4C.

That is, the rear-end face of the rear-side encapsulating layer 5B is formed to extend in the left-right directions so as to overlap the middle portion in the front-rear directions (slightly front-side portion) of the electrode 4B of the rear-end portion when projected in the thickness direction, and the front-end face of the rear-side encapsulating layer 5B is formed to extend in the left-right directions so as to overlap the center portion in the front-rear directions of the rear-side portion 42 of the electrode 4C at the rear side of the rear-end face of the front-side encapsulating layer 5A when projected in the thickness direction.

In this manner, all of the LEDs 3 and all of the wires 6 of the light-emitting device 10B of the rear row are covered with the encapsulating layer 5B at the rear-side.

On the substrate 2 of the light-emitting device assembly 1, the encapsulating region 8 and the electrode region 9 are formed.

As shown in FIGS. 1 and 2, the encapsulating region 8 includes at least the LEDs 3 when viewed from the top. To be specific, the encapsulating region 8 includes all of the LEDs 3 and the wires 6, and is a region defined by the encapsulating layer 5 and formed on the substrate 2. That is, the encapsulating region 8 is defined, when viewed from the top, by the peripheral end edge of the encapsulating layer 5.

That is, the encapsulating region 8 is formed from an encapsulating region 8A at the front-side and an encapsulating region 8B at the rear-side corresponding to the encapsulating layer 5A at the front-side and the encapsulating layer 5B at the rear-side, respectively, and the encapsulating region 8A at the front-side and the encapsulating region 8B at the rear-side are separated and defined into a plural number (e.g., 2) in the front-rear directions in spaced-apart relation, and each of the encapsulating region 8A at the front-side and the encapsulating region 8B at the rear-side is defined as a generally rectangular shape when viewed from the top extending continuously in the left-right directions.

Meanwhile, the electrode region 9 is a region in the substrate 2 other than the encapsulating region 8 and the fragile region 7 described later. To be specific, the electrode region 9 is a region defined by the electrode 4 exposed from the encapsulating layer 5 when viewed from the top.

To be specific, the electrode region 9 is formed from the electrode region 9A at the front-end portion, the electrode region 9B at the rear-end portion, and the electrode region 9C at the center portion in the front-rear directions corresponding to the electrode 4A at the front-end portion, the electrode 4B at the rear-end portion, and the electrode 4C at the center portion in the front-rear directions, respectively, exposed from the encapsulating layer 5.

Each of the electrode region 9A at the front-end portion and the electrode region 9B at the rear-end portion is divided and partitioned into a plural number by the plurality of vertical fragile regions 27 to be described later in the left-right directions, and each of the plurality of the electrode regions 9A at the front-end portion and each of the plurality of electrode region 9B at the rear-end portion partitioned by the vertical fragile regions 27 is defined as a generally rectangular shape extending in the left-right directions when viewed from the top.

The electrode region 9C at the center portion in the front-rear directions is divided in the left-right directions into a plural number by a plurality of vertical fragile regions 27 to be described later, and at the same time, divided and partitioned into two in the front-rear directions by a single horizontal fragile region 17, and each of the plurality of the electrode regions 9C partitioned by the vertical fragile regions 27 and the horizontal fragile region 17 is sectioned into a generally rectangular shape extending in the left-right directions when viewed from the top.

In this manner, on the substrate 2 of the light-emitting device assembly 1, a plurality of electrode regions 9 (e.g., 40 (=4 rows (front-rear directions)×10 columns (left-right directions))), and a plurality of encapsulating regions 8 (e.g., 20 (=2 rows (front-rear directions)×10 columns (left-right directions))) are formed into a pattern.

Furthermore, on the substrate 2 of the light-emitting device assembly 1, a fragile region 7 is formed.

As shown in FIG. 1, the fragile region 7 is a region of a generally grid on the substrate 2 when viewed from the top, and is formed so as to partition the light-emitting device assembly 1, and for example, is formed to partition into individual light-emitting devices 10, i.e., ten light-emitting devices in the left-right directions and two light-emitting devices 10 in the front-rear directions. To be specific, the fragile region 7 is formed along the front-rear directions so as to sectionalize a unit including the LEDs 3X in the left column and the LEDs 3Y in the right column of each of the light-emitting devices 10, and is formed along the left-right directions so as to transverse in the left-right directions the center portion in the front-rear directions of the electrode 4 (electrode 4C at the center portion in the front-rear directions) between the encapsulating layer 5A at the front-side and the encapsulating layer 5B at the rear-side. To be specific, the fragile region 7 is formed from a vertical fragile region 27 extending in the front-rear directions and formed in a plural number (e.g., 9) in the left-right directions in spaced-apart relation, and a horizontal fragile region 17 of a generally straight line extending in the left-right directions when viewed from the top.

The vertical fragile region 27 is formed so as to partition the light-emitting devices 10A of the front row that are continuously encapsulated by the encapsulating layer 5A at the front-side (encapsulating region 8A at the front-side) in the left-right directions, and to partition the light-emitting devices 10B of the rear row in the left-right directions that are encapsulated continuously by the encapsulating layer 5B at the rear-side (encapsulating region 8B at the rear-side). In the vertical fragile region 27, the encapsulating layer 5 is formed on the upper face of the substrate 2, but because cuts 11 to be described later are formed on the substrate 2, its mechanical strength is weak compared with the surrounding of the vertical fragile region 27, to be specific, both side portions in the left-right directions of the vertical fragile region 27.

Meanwhile, at the front-end portion, rear-end portion, and center portion in the front-rear directions of the vertical fragile region 27, the substrate 2 is exposed from the electrode 4A at the front-end portion (electrode region 9A at the front-end portion), electrode 4B at the rear-end portion (the electrode region 9B at the rear-end portion) and the electrode 4C at the center portion in the front-rear directions (electrode region 9C at the center portion in the front-rear directions).

The horizontal fragile region 17 is a region disposed between the encapsulating layer 5A at the front-side and the encapsulating layer 5B at the rear-side that are next to each other in spaced-apart relation in the front-rear directions, to be more specific, is a region partitioned by and between the front-side portion 41 and the rear-side portion 42 of the electrode 4C at the center portion in the front-rear directions.

In the fragile region 7, as shown in FIG. 3 (a), cuts 11 are formed at the lower face (bottom face) of the substrate 2, the cuts 11 being cut into a generally downward opened V-shape in cross section. Thus, the fragile region 7 is formed to have a weak mechanical strength compared with the surrounding substrate 2.

As shown in FIG. 3 (b), in the fragile region 7, the cuts 11 are formed intermittently along the longitudinal direction. To be specific, while the cuts 11 in the vertical fragile region 27 are formed intermittently in the front-rear directions, the cuts 11 in the horizontal fragile region 17 are formed intermittently in the left-right directions.

In the substrate 2, only the fragile region 7, the encapsulating region 8, and the electrode region 9 are formed. That is, in the substrate 2, the region other than the fragile region 7, the encapsulating region 8, and the electrode region 9 does not exist. On the substrate 2, in a portion corresponding to the light-emitting device 10, in the front-rear directions, the electrode region 9A, the encapsulating region 8A, the front-side electrode region 9C, the horizontal fragile region 17, the electrode region 9C of the rear-side, the encapsulating region 8B, and the electrode region 9B are arranged sequentially. On the substrate 2, in a portion corresponding to the light-emitting device 10, in the left-right directions, the encapsulating region 8 and the fragile region 7 are arranged alternately in the left-right directions, to be specific, the encapsulating region 8, the fragile region 7, . . . , the fragile region 7, and the encapsulating region 8 are arranged sequentially.

Next, description is given below of a method for producing the light-emitting device assembly 1 with reference to FIG. 4 and FIG. 5.

In this method, as shown in FIG. 4 (*a*), first, a substrate 2 is prepared.

For the substrate 2, for example, substrates generally used for optical semiconductor devices including a substrate of ceramic such as alumina, a substrate of resin such as polyimide, and a metal core substrate in which metal plate is used as the core are used.

Next, in this method, as shown in FIG. 4 (*b*), the electrode 4 is formed into the above-described pattern.

Examples of the material that forms the electrode 4 include conductive materials such as silver, gold, copper, iron, platinum, and alloys thereof. Preferably, silver is used.

To form the electrode 4, for example, plating, application, and bonding of the conductor layer are used, and preferably, application is used. The application include printing, and a conductor paste (preferably, a silver paste containing silver) containing the above-described conductive material is applied (including printing), and thereafter, as necessary, dried to form the electrode 4 into the above-described pattern. Bonding of the conductor layer includes, for example, when the substrate 2 is composed of a substrate having a conductive portion such as a metal core substrate, a method in which the insulating layer (not shown) is laminated on the upper face of the substrate 2 in the same pattern as that of the electrode 4, and thereafter, a conductor layer molded in advance into a shape of the electrode 4 is bonded onto the insulating layer.

The size of the electrode 4 is suitably selected, and width W1 of the electrode 4A at the front-end portion, electrode 4B at the rear-end portion, and front-side portion 41 and the rear-side portion 42 (length in the front-rear directions) of electrode 4C at the center portion in the front-rear directions is, for example, 0.3 mm or more, preferably 1 mm or more, and for example, 5 mm or less, preferably 3 mm or less.

Distance D11 between the front-side portion 41 and the rear-side portion 42 of the electrode 4C at the center portion in the front-rear directions is, for example, 0.1 mm or more, preferably 0.25 mm or more, and for example, 3 mm or less, preferably 2 mm or less.

The electrode 4 has a thickness of for example, 1 μm or more, preferably 5 μm or more, and for example, 100 μm or less, preferably 50 μm or less.

An electrode-bearing substrate 102 including the substrate 2 and the electrode 4 formed on the upper face (surface) thereof is obtained in this manner.

Next, in this method, as shown in FIG. 4 (*c*), the LEDs 3 are mounted on the substrate 2 in the above-described arrangement.

The size and the pitch of the LEDs 3 are suitably set in accordance with use and purpose of the light-emitting device 10, and to be specific, distance in the front-rear directions (interval) D1 of LEDs 3X of the left column, and distance in the front-rear directions (interval) D2 of the LEDs 3Y in the right column corresponding to the light-emitting device 10 are, for example, 0.3 mm or more, preferably, 0.5 mm or more, and for example, 5 mm or less, preferably 3 mm or less.

As shown in FIG. 2, in each of the light-emitting devices 10, distance (interval) D3 between the LED 3X in the left column and LED 3Y in the right column in the left-right directions when projected in the front-rear directions is, for example, 0.3 mm or more, preferably 0.5 mm or more, and for example, 5 mm or less, preferably 3 mm or less.

At the front-side portion of each of the light-emitting devices 10, distance (interval) D5 between the LED 3X at the foremost in the left column and the electrode 4A at the front-end portion, and distance (interval) D6 between LED 3Y at the rearmost in the right column and the front-side portion 41 of the electrode 4C at the center portion in the front-rear directions is, for example, 0.3 mm or more, preferably 0.5 mm or more, and for example, 10 mm or less, preferably 5 mm or less. At the rear-side portion of each of the light-emitting devices 10, distance (interval) D7 between LED 3X at the foremost in the left column and the rear-side portion 42 of the electrode 4C at the center portion in the front-rear directions, and distance (interval) D8 between the LED 3Y at the rearmost in right column and the electrode 4B at the rear-end portion is, for example, 0.3 mm or more, preferably 0.5 mm or more, and for example, 10 mm or less, preferably 5 mm or less.

The length in the front-rear directions and the length in the left-right directions of the LEDs 3 are not particularly limited, and can be decided in accordance with the target illuminance of the light-emitting device 10.

The LED 3 has a thickness of, for example, 1 μm or more, preferably 100 μm or more, and for example, 500 μm or less, preferably 200 μm or less.

Next, in this method, as shown in FIG. 4 (*d*), the wires 6 are electrically connected between the plurality of LEDs 3, and between the LEDs 3 and the electrodes 4 to achieve the above-described arrangement by, for example, ultrasonic joining. The height of the wires 6 is, that is, the distance between the upper end portion of the wire 6 and the upper face of the substrate 2 is, for example, 0.01 mm or more, preferably 0.1 mm or more, and for example, 1.0 mm or less, preferably 0.6 mm or less.

Next, in this method, as shown in FIG. 5 (*e*), the encapsulating layer 5 is formed into the above-described pattern.

To form the encapsulating layer 5 into the above-described pattern, for example, an encapsulating sheet 12 (phantom line) prepared from an encapsulating resin composition containing an encapsulating resin is formed in advance, and then the encapsulating sheet 12 is laminated on the substrate 2 to include a portion of the electrode 4, the LEDs 3, and the wire 6.

Examples of the encapsulating resin include a thermoplastic resin which is plasticized by heating, a thermosetting resin which is cured by heating, and an activation energy curable resin which is cured by irradiation of an activation energy ray (e.g., ultraviolet ray, electron ray, etc.).

Examples of the thermoplastic resin include vinyl acetate resin, ethylene-vinyl acetate copolymer (EVA), vinyl chloride resin, and an EVA-vinyl chloride resin copolymer.

Examples of the thermosetting resin and the activation energy ray-curable resin include silicone resin, epoxy resin, polyimide resin, phenol resin, urea resin, melamine resin, and unsaturated polyester resin.

For the encapsulating resin, preferably, a thermosetting resin is used, and more preferably, silicone resin is used.

Examples of the encapsulating resin composition containing silicone resin as the encapsulating resin include thermosetting silicone resin compositions such as a two-step curable silicone resin composition and a one-step curable silicone resin composition.

The two-step curable silicone resin composition is a thermosetting silicone resin that has a 2-stage reaction mechanism, is brought into B-stage (semi-cured) at the first-stage reaction, and is brought into C-stage (completely cured) at the second-stage reaction. Meanwhile, the one-step curable silicone resin is a thermosetting silicone resin that has a first stage reaction mechanism, and is completely cured at the first-stage reaction.

B-stage is a state between A-stage, in which the thermosetting silicone resin composition is liquid, and C-stage, in which the thermosetting silicone resin composition is completely cured, and is a state where curing and gelling progresses slightly, and the modulus of elasticity is smaller than the modulus of elasticity in C-stage.

Examples of the uncured two-step curable type silicone resin composition (before curing in the first step) include a condensation reaction-addition reaction curable silicone resin composition.

The condensation reaction-addition reaction curable silicone resin composition is a thermosetting silicone resin composition that can undergo condensation reaction and addition reaction by heating, to be more specific, is a thermosetting silicone resin composition that can undergo condensation reaction by heating and brought into B-stage (semi-cured), then by further heating, can undergo addition reaction (to be specific, for example, hydrosilylation reaction) and brought into C-stage (completely cured).

Examples of such a condensation reaction-addition reaction curable silicone resin composition include a first condensation reaction-addition reaction curable silicone resin composition containing a polysiloxane having silanol groups at both ends, alkenyl group-containing trialkoxysilane, organo hydrogen siloxane, a condensation catalyst, and a hydrosilylation catalyst; a second condensation reaction-addition reaction curable silicone resin composition containing a polysiloxane having silanol groups at both ends, an ethylene unsaturated hydrocarbon group-containing silicon compound (hereinafter referred to as ethylene silicon compound), an epoxy group-containing silicon compound, organo hydrogen siloxane, a condensation catalyst, and an addition catalyst (hydrosilylation catalyst); a third condensation reaction-addition reaction curable silicone resin composition containing a silicone oil having silanols at both ends, alkenyl group-containing dialkoxy alkylsilane, organo hydrogen siloxane, a condensation catalyst, and a hydrosilylation catalyst; a fourth condensation reaction-addition reaction curable silicone resin composition containing organopolysiloxane having at least two alkenylsilyl groups in one molecule, organopolysiloxane having at least two hydrosilyl groups in one molecule, a hydrosilylation catalyst, and a curing retarder; a fifth condensation reaction-addition reaction curable silicone resin composition containing a first organopolysiloxane having at least two ethylene unsaturated hydrocarbon groups and at least two hydrosilyl groups in combination in one molecule, a second organopolysiloxane not having an ethylene unsaturated hydrocarbon group but having at least two hydrosilyl groups in one molecule, a hydrosilylation catalyst, and a hydrosilylation suppresser; a sixth condensation reaction-addition reaction curable silicone resin composition containing a first organopolysiloxane having at least two ethylene unsaturated hydrocarbon groups and at least two silanol-groups in combination in one molecule, a second organopolysiloxane not having an ethylene unsaturated hydrocarbon group but at least two hydrosilyl groups in one molecule, a hydrosilylation retarder, and a hydrosilylation catalyst; a seventh condensation reaction-addition reaction curable silicone resin composition containing a silicon compound, and a boron compound, or an aluminum compound; and an eighth condensation reaction-addition reaction curable silicone resin composition containing polyaluminosiloxane and a silane coupling agent.

These condensation reaction-addition reaction curable silicone resin compositions may be used singly or in a combination of two or more.

For the condensation reaction-addition reaction curable silicone resin composition, preferably, the second condensation reaction-addition reaction curable silicone resin composition is used.

In the second condensation reaction-addition reaction curable silicone resin composition, the polysiloxane having silanol groups at both ends, the ethylene silicon compound, and the epoxy group-containing silicon compound are condensation materials (material subjected to condensation reaction), and the ethylene silicon compound and organo hydrogen siloxane are addition materials (material subjected to addition reaction).

Examples of the one-step curable silicone resin composition include addition reaction curable silicone resin composition.

The addition reaction curable silicone resin composition contains, for example, ethylene unsaturated hydrocarbon group-containing polysiloxane as a main component, and organo hydrogen siloxane as a cross-linking agent.

Examples of the ethylene unsaturated hydrocarbon group-containing polysiloxane include alkenyl group-containing polydimethylsiloxane, alkenyl group-containing polymethylphenylsiloxane, and alkenyl group-containing polydiphenylsiloxane.

Addition reaction curable silicone resin compositions are available, usually, with separate packages of ethylene unsaturated hydrocarbon group-containing polysiloxane and organo hydrogen siloxane. To be specific, the addition reaction curable silicone resin composition is provided as two components: A liquid containing a main component (ethylene unsaturated hydrocarbon group-containing polysiloxane), and B liquid containing a cross-linking agent (organo hydrogen siloxane). A known catalyst necessary for addition reaction of these is added to ethylene unsaturated hydrocarbon group-containing polysiloxane.

With such an addition reaction curable silicone resin composition, the main component (A liquid) and the cross-linking agent (B liquid) are mixed to prepare a mixture liquid, and in the step of molding into a shape of the encapsulating sheet 12 from the mixture liquid, ethylene unsaturated hydrocarbon group-containing polysiloxane and organo hydrogen siloxane undergo addition reaction, thereby curing the addition reaction curable silicone resin composition, and forming silicone elastomer (cured substance).

The encapsulating resin composition may contain, as necessary, phosphor and a filler in suitable proportions.

Examples of the phosphor include, for example, yellow phosphor that can convert blue light into yellow light. Examples of such a phosphor include, for example, a phosphor in which composite metal oxide or metal sulfide is doped with metal atoms such as cerium (Ce) and europium (Eu).

To be specific, examples of the phosphor include garnet phosphor having a garnet crystal structure such as $Y_3Al_5O_{12}$:Ce (YAG (yttrium-aluminum-garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; silicate phosphor such as $(Sr,Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$:Mn and $SrAl_2O_4$:Eu; sulfide phosphor such as ZnS:Cu, Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlON; nitride phosphor such as $CaAlSiN_3$:Eu and $CaSi_5N_8$:Eu; and fluoride phosphor such as $K_2SiF_6$:Mn and $K_2TiF_6$:Mn. Preferably, garnet phosphor, more preferably, $Y_3Al_5O_{12}$:Ce is used.

Examples of the filler include silicone microparticles, glass, alumina, silica (fused silica, crystalline silica, ultrafine amorphous silica, hydrophobic ultrafine silica, etc.), titania, zirconia, talc, clay, and barium sulfate. These fillers may be used singly or in a combination of two or more. Preferably, silicone microparticles and silica are used.

To the encapsulating resin composition, for example, known additives such as a modifier, surfactant, die, pigment, discoloration inhibitor, and ultraviolet absorber can be added in a suitable proportion.

The encapsulating sheet 12 is composed of, for example, a thermosetting silicone resin composition before being completely cured, or after being completely cured, preferably, composed of a thermosetting silicone resin composition before being completely cured.

More preferably, when the thermosetting silicone resin composition is a two-step curable silicone resin composition, the encapsulating sheet 12 is composed of a 1st-step cured material of the two-step curable silicone resin composition, and when the thermosetting silicone resin composition is a one-step curable silicone resin composition, the encapsulating sheet 12 is composed of a uncured material (before curing) of the one-step curable silicone resin composition.

Particularly preferably, the encapsulating sheet 12 is composed of a 1st-step cured material of the two-step curable silicone resin composition.

To form the encapsulating sheet 12, for example, the above-described encapsulating resin composition (as necessary including a fluorescent agent, filler, etc.) is applied on a release film (not shown) by a method such as casting, spin coating, and roll coating to give a suitable thickness into the above-described pattern, and as necessary heated. When the encapsulating sheet 12 contains the two-step curable silicone resin composition, the encapsulating sheet 12 is brought into B-stage (semi-cured).

In this manner, the encapsulating sheet 12 having the above-described pattern (that is, a pattern conforming to the encapsulating layer 5A at the front-side and the encapsulating layer 5B at the rear-side) in a sheet form is formed.

The encapsulating sheet 12 has a hardness, i.e., a compressive modulus of elasticity of, for example, 0.01 MPa or more, preferably 0.04 MPa or more, and for example, 1.0 MPa or less, preferably 0.2 MPa or less.

The encapsulating sheet 12 has a thickness of without particular limitation, for example, 100 μm or more, preferably 300 μm or more, and for example, 2000 μm or less, preferably 1000 μm or less.

To form the encapsulating layer 5, as shown by the phantom line in FIG. 5 (e), the encapsulating sheet 12 is allowed to face the LEDs 3 and the wire 6 in up-down direction in spaced-apart relation, and then, as shown in the arrow, the encapsulating sheet 12 is descended (pressed down), thereby covering the LEDs 3 and the wire 6 with the encapsulating sheet 12.

Then, the encapsulating sheet 12 is pressed against and attached to the substrate 2. The pressing for attachment is performed, preferably, under a reduced-pressure environment. The pressing temperature is, for example, 0° C. or more, preferably, 15° C. or more, and for example, 40° C. or less, preferably, 35° C. or less. For the pressing for attachment, although not shown, a known presser is used.

Thereafter, for example, when the encapsulating sheet 12 contains a thermosetting resin, the encapsulating sheet 12 is cured by heat, thereby forming an encapsulating layer 5. To be specific, when the encapsulating sheet 12 contains a two-step curable silicone resin composition, the encapsulating sheet 12 is brought into C-stage (completely cured). To be more specific, the curing conditions are, when the two-step curable silicone resin composition contains a condensation-addition reaction curable silicone resin composition, conditions under which addition reaction (hydrosilylation reaction) progresses.

To be specific, the heating temperature is, for example, 80° C. or more, preferably, 100° C. or more, and for example, 200° C. or less, preferably, 180° C. or less, and the heating time is, for example, 0.1 hour or more, preferably 1 hour or more, and for example, 20 hours or less, preferably 10 hours or less.

In this manner, the encapsulating layer 5 can be formed, and a portion of the electrode 4, and the LED 3 and the wire 6 can be encapsulated with the encapsulating layer 5.

With this formation of the encapsulating layer 5, the encapsulating region 8 and the electrode region 9 are defined on the substrate 2.

The electrode 4A at the front-end portion exposed from the encapsulating layer 5A at the front-side and the electrode 4B at the rear-end portion exposed from the encapsulating layer 5B at the rear-side has a width (length in the front-rear directions) W3 (that is, a width (length in the front-rear directions) W3 of the electrode region 9A at the front-end portion and the electrode region 9B at the rear-end portion) is, in view of heat-releasing characteristics and connectivity (to be specific, soldering) between the wires 13 (described later), for example, 0.5 mm or more, preferably 0.75 mm or more, and for example, 5 mm or less, preferably 3 mm or less. The front-side portion 41 exposed from the encapsulating layer 5 has a width W7, and the rear-side portion 42 exposed from the encapsulating layer 5 has a width W7 of, for example, 0.5 mm or more, preferably 0.75 mm or more, and for example, 5 mm or less, preferably 3 mm or less. The electrode region 9C at the center portion in the front-rear directions has a width (length in the front-rear directions) in total W4 of, in view of heat-releasing characteristics and connectivity (to be specific, soldering) between the wires 13 (described later) of, for example, 1.0 mm or more, preferably 1.5 mm or more, and for example, 10 mm or less, preferably 6 mm or less.

Thereafter, as shown in FIG. 5 (f), cuts 11 are formed on the substrate 2.

To form cuts 11 on the substrate 2, for example, laser processing, or etching is used. Preferably, laser processing is used.

The cut 11 has a depth D4 of, for example, 100 μm or more, preferably 200 μm or more, and for example, 700 μm or less, preferably 500 μm or less. The cut 11 has a width W5 of, for example, 20 μm or more, preferably 40 μm or more, and for example, 200 μm or less, preferably 150 μm or less. As shown in FIG. 3 (b), the cut 11 has a length L1 of, for example, 100 μm or more, preferably 200 μm or more, and for example, 700 μm or less, preferably 500 μm or less.

In this manner, a fragile region 7 is defined by the cuts 11 formed on the substrate 2.

In this manner, a light-emitting device assembly 1 can be produced.

Next, description is given below of a method for producing light-emitting devices 10 from the produced light-emitting device assembly 1.

To produce the light-emitting device 10, the light-emitting device assembly 1 is cut, as shown in FIG. 5 (g), along the cuts 11 so as to singulate the light-emitting device assembly 1 into light-emitting devices 10. To cut the light-emitting device assembly 1, for example, the substrate 2 is bent (e.g., break, to be specific, break like a bar of chocolate) along the cut 11.

In this manner, as shown in FIG. 5 (g), a plurality of (e.g., 20) light-emitting devices 10 are produced.

Thereafter, to the electrode 4 of the produced light-emitting device 10, as shown by the phantom line in FIG. 5 (g), one end portion of the wire 13 is electrically connected by, for example, ultrasonic joining. To the other end portion of the wire 13, a power source which is not shown is electrically connected, and in this manner, the LEDs 3 are connected to the power source (not shown) through the electrode 4 and the wire 13. To the light-emitting device 10, electric power is supplied from the power source (not shown) through the wire 13, thus allowing the LEDs 3 to emit light.

In the light-emitting device assembly 1, a fragile region 7 is formed on the substrate 2, and by cutting the substrate 2 of the light-emitting device assembly 1 therealong, a plurality of light-emitting devices 10 can be obtained easily.

In this light-emitting device assembly 1, the cuts 11 are formed at the fragile region 7, and therefore the strength of the fragile region 7 can be further surely reduced, and thus cutting of the substrate 2 along the fragile region 7 can be performed more easily and surely.

In the light-emitting device assembly 1, a horizontal fragile region 17 is formed in a space, formed as a spaced-apart region, between the encapsulating layer 5A at the front-side and the encapsulating layer 5B at the rear-side formed for encapsulating the light-emitting devices 10 in spaced-apart relation, and thus by cutting the substrate 2 along the horizontal fragile region 17, the light-emitting devices 10 can be obtained surely and effectively.

However, in conventional light-emitting device assemblies, each of the positive electrode external connection land and the negative electrode external connection land is electrically connected to the light-emitting element by, for example, internal electrodes. Furthermore, by connecting external connection wire to each of the positive electrode external connection land and the negative electrode external connection land, the positive electrode external connection land and the negative electrode external connection land are electrically connected to a power source.

However, in a light-emitting device assembly including a light-emitting device, heat is generated along with light emission of the LED, and thus the temperature easily increases, and thus excellent heat-releasing characteristics are required. In the above-described conventional light-emitting device assembly, heat generation of the light-emitting element can be released to the outside through the internal electrodes from the positive electrode external connection land and the negative electrode external connection land. However, the positive electrode external connection land and the negative electrode external connection land are formed relatively small in the light-emitting device, and thus an attempt to improve heat-releasing characteristics is limited.

On the other hand, in the light-emitting device assembly, excellent connectivity of the external connection wires to the positive electrode external connection land and the negative electrode external connection land is required also. However, in conventional light-emitting devices, the positive electrode external connection land and the negative electrode external connection land are formed relatively small, and thus an attempt to improve connectivity is limited.

On the other hand, in the light-emitting device assembly 1, only the fragile region 7, the encapsulating region 8, and the electrode region 9 are formed on the substrate 2. That is, other than the fragile region 7 and the encapsulating region 8 of the substrate 2, the electrode region 9 is formed entirely, and thus the electrode region 9 is excellent in thermal conductivity, and improvement in heat-releasing characteristics of the light-emitting device assembly 1 can be achieved. Furthermore, other than the fragile region 7 and the encapsulating region 8 of the substrate 2, the electrode region 9 is entirely formed, and thus the electrode region 9 is relatively large, and thus connection of the wires 13 to the electrode region 9 can be achieved easily and surely.

Thus, the light-emitting device assembly 1 is excellent in both heat-releasing characteristics and connectivity to the wires.

The light-emitting device assembly 1 can be small-sized.

Furthermore, in the light-emitting device 10, in the encapsulating layer 5A at the front-side and the encapsulating layer 5B at the rear-side formed as a continuous region that continuously encapsulates the light-emitting devices 10 that are disposed next to each other, the light-emitting devices 10 can be obtained by easily cutting the substrate 2 and the encapsulating layer 5 along the vertical fragile region 27. Thus, the light-emitting devices 10 can be obtained surely and effectively.

Furthermore, the light-emitting device 10 can be produced by easy steps from the light-emitting device assembly 1.

<Modification>

Figure 6:
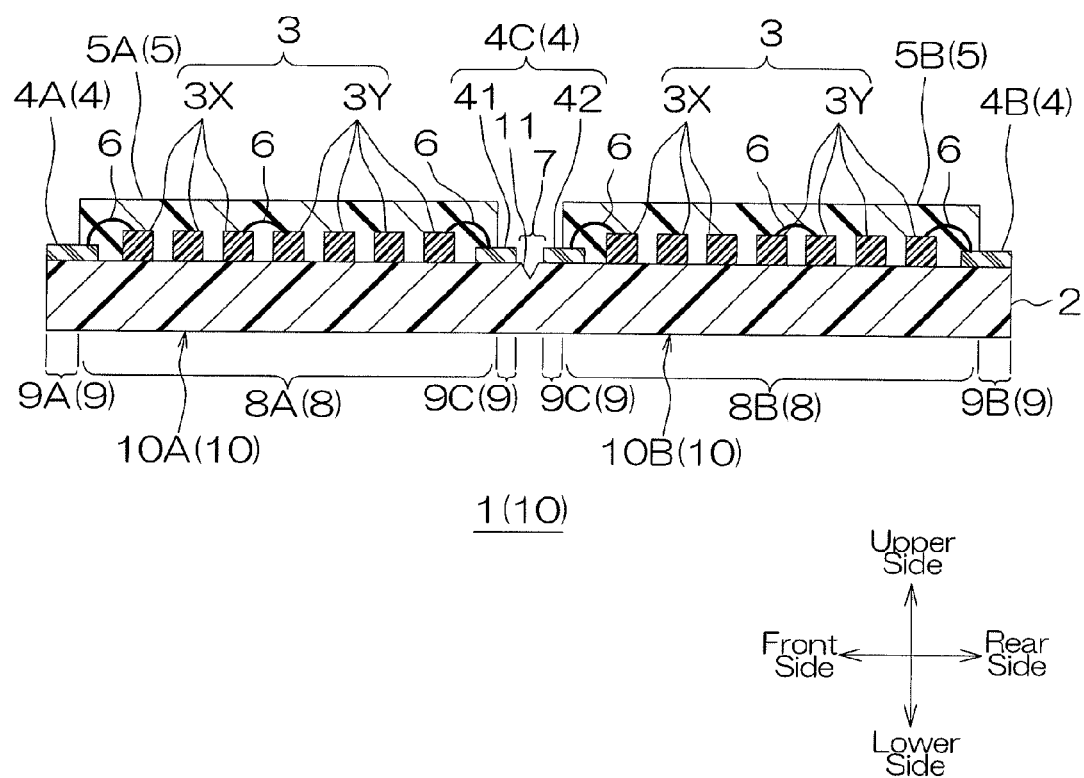
FIG. 6 shows an enlarged cross-sectional view of a modification of the first embodiment of the light-emitting device assembly of the present invention.
Figure 7:
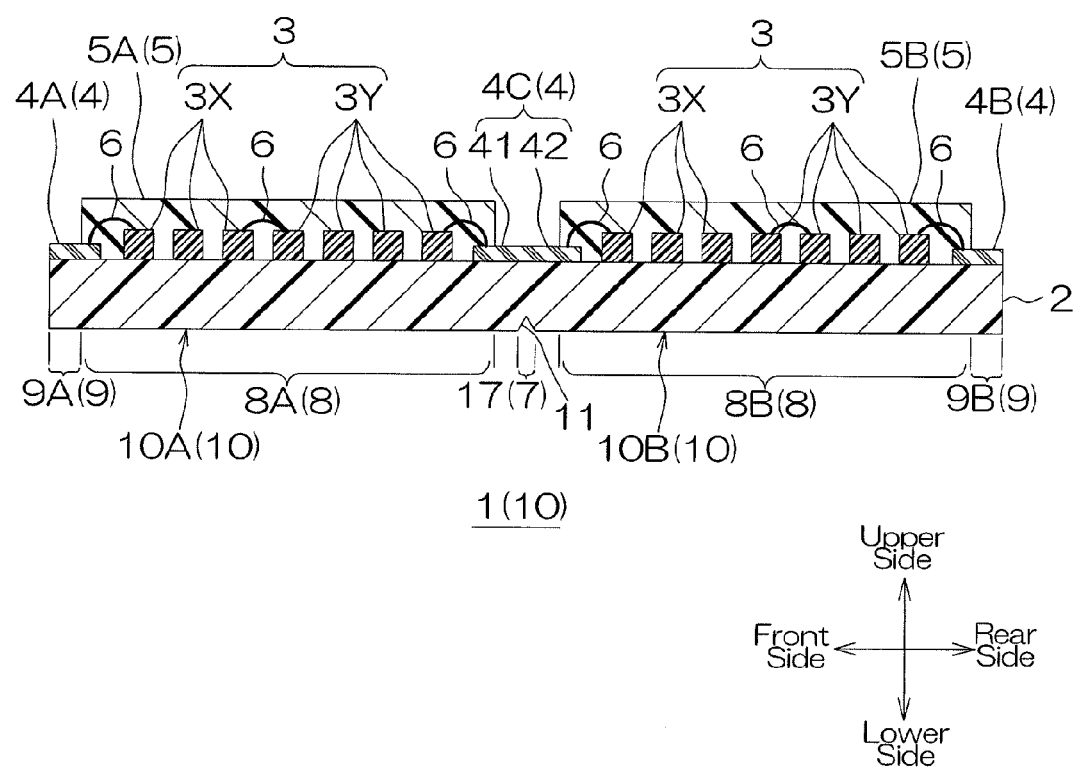
FIG. 7 shows an enlarged cross-sectional view of a modification of the first embodiment of the light-emitting device assembly of the present invention.

In FIGS. 6 and 7, the members that are the same with those of the first embodiment are given with the same reference numbers, and detailed descriptions thereof are omitted.

In the first embodiment, as shown in FIG. 3 (a), the cut 11 is formed in the horizontal fragile region 17 at the lower face of the substrate 2 by cutting into a generally downward opened V-shape in cross section, but for example, as shown in FIG. 6, the cut 11 can also be formed on the upper face of the substrate 2 by cutting into a generally upward opened V-shape in cross section.

The cut 11 can be formed into the above-described shape also in the vertical fragile region 27, but in such a case, the substrate 2 is processed into the above-described shape in advance, and thereafter, the encapsulating layer 5 is formed on upper face of the substrate 2.

In the first embodiment, as shown in FIG. 3 (a), the substrate 2 is exposed from the front-side portion 41 and the rear-side portion 42 of the electrode 4C at the center portion in the front-rear directions, but for example, as shown in FIG. 7, the front-side portion 41 and the rear-side portion 42 of the electrode 4C at the center portion in the front-rear directions can be formed continuously in the front-rear directions, and in this manner, the substrate 2 of the vertical fragile region 27 can be covered.

In such a case, the vertical fragile region 27 is a region defined by the cuts 11.

Preferably, as in the first embodiment, the vertical fragile region 27 allows the substrate 2 to expose from the front-side portion 41 and the rear-side portion 42 of the electrode 4C at the center portion in the front-rear directions. In this manner, strength of the fragile region 7 can be reduced surely.

In the first embodiment, as shown in FIG. 3 (b), the cuts 11 are provided intermittently in the fragile region 7, but for example, although not shown, the cuts can also be formed continuously up to the middle in the thickness direction of the substrate 2. To be specific, the cuts 11 in the vertical fragile region 27 are formed along the front-rear directions continuously, and/or the cuts 11 in the horizontal fragile region 17 are formed continuously along the left-right directions.

In the first embodiment, as shown in FIG. 1, the vertical fragile region 27 along the front-rear directions is formed so as to partition per unit composed of the LEDs 3X in the left column and the LEDs 3Y in the right column, but for example, although not shown, can also be formed so as to partition per a plurality of units.

In the first embodiment, the wires 6 electrically connect the plurality of LEDs 3 in each of the light-emitting devices 10, but for example, although not shown, internal electrodes can be provided on the substrate 2, and the LEDs 3 are electrically connected not through the wire 6 but through the internal electrodes of the substrate 2.

Furthermore, in the first embodiment, the electrode 4 and the LEDs 3 are electrically connected through the wires 6 in each of the light-emitting devices 10, but for example, although not shown, internal electrode can be provided in the substrate 2, and the electrode 4 and the LEDs 3 can be electrically connected not through the wire 6 but through the internal electrode of the substrate 2.

In the first embodiment, in each of the light-emitting devices 10, two LEDs 3 are arranged in the left-right directions, and ten LEDs 3 are arranged the front-rear directions (2×10), but the number and arrangement of the LEDs 3 are not limited to the above-described one. For example, although not shown, only one LED 3 can be provided in each of the light-emitting devices 10.

Furthermore, in the first embodiment, the encapsulating layer 5 is formed from the encapsulating sheet 12 shown in the phantom line of FIG. 5 (*e*), but for example, the encapsulating layer 5 can also be formed by potting the above-described encapsulating resin composition. In the potting, a protection member such as a dam member (not shown) is set in advance in a region (to be specific, the electrode region 9) where the encapsulating layer 5 is not formed, and while protecting the electrode region 9, the encapsulating layer 5 is formed and then the protection member is removed.

Preferably, the encapsulating layer 5 is formed from the encapsulating sheet 12. By forming the encapsulating sheet 12 from the encapsulating layer 5, the steps of setting and removing the protection member are unnecessary, and to that extent, the encapsulating layer 5 can be formed easily.

In the first embodiment, as shown in FIG. 4, the electrodes 4 (ref: FIG. 4 (*b*)) are provided, and thereafter, the LEDs 3 and the wires 6 are sequentially provided (ref: FIG. 4 (*c*) and FIG. 4 (*d*)) but the sequence is not particularly limited. For example, although not shown, the LEDs 3 and the wires 6 can be sequentially provided, and thereafter, the electrodes 4 can be provided.

In the first embodiment, the LEDs 3 are given as an example of the optical semiconductor element of the present invention for illustration, but for example, LD (laser diode) 3 can also be used as the optical semiconductor element of the present invention.

Second Embodiment

Figure 8:
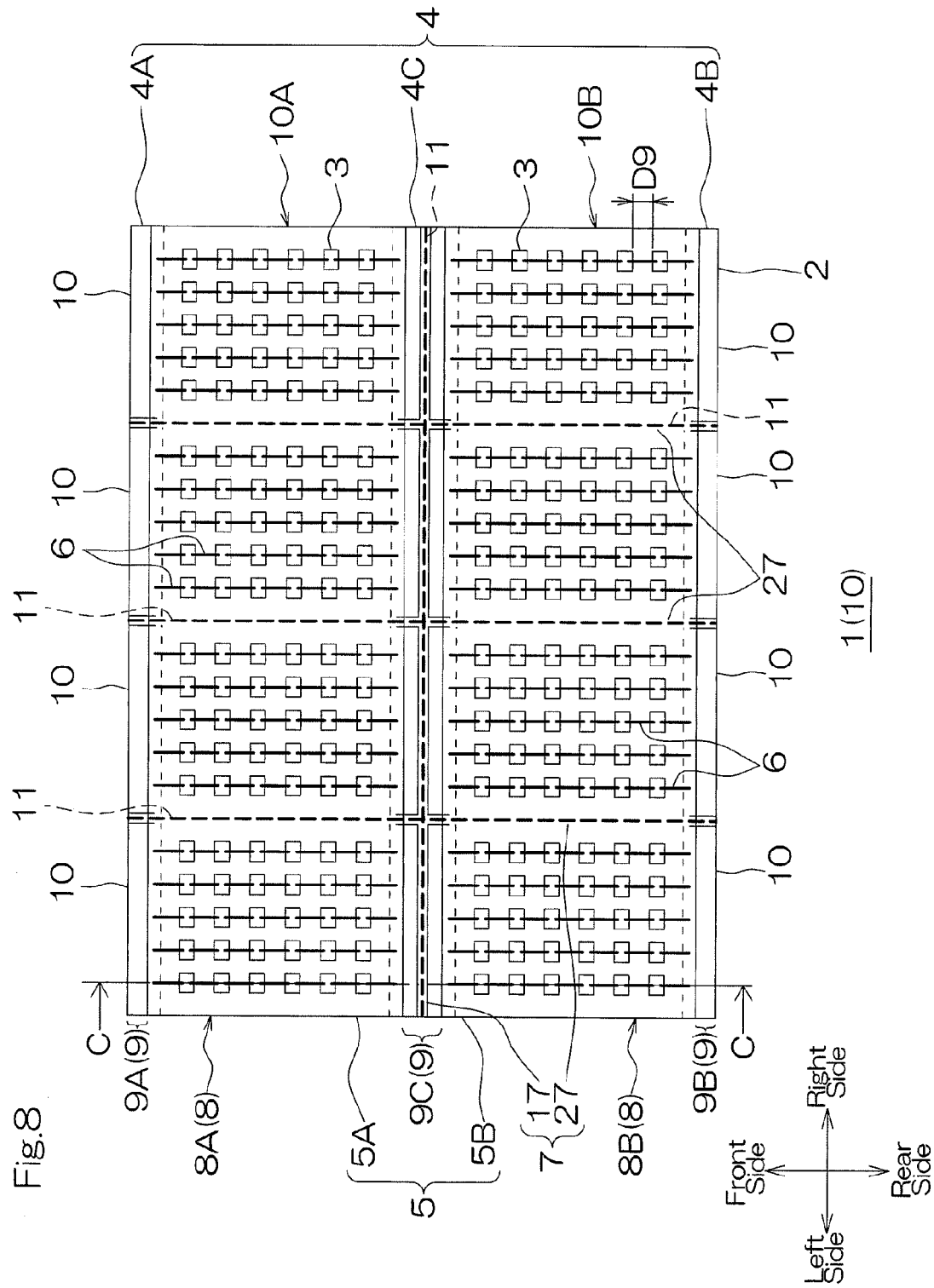
FIG. 8 shows a plan view of a second embodiment of the light-emitting device assembly of the present invention.
Figure 9:
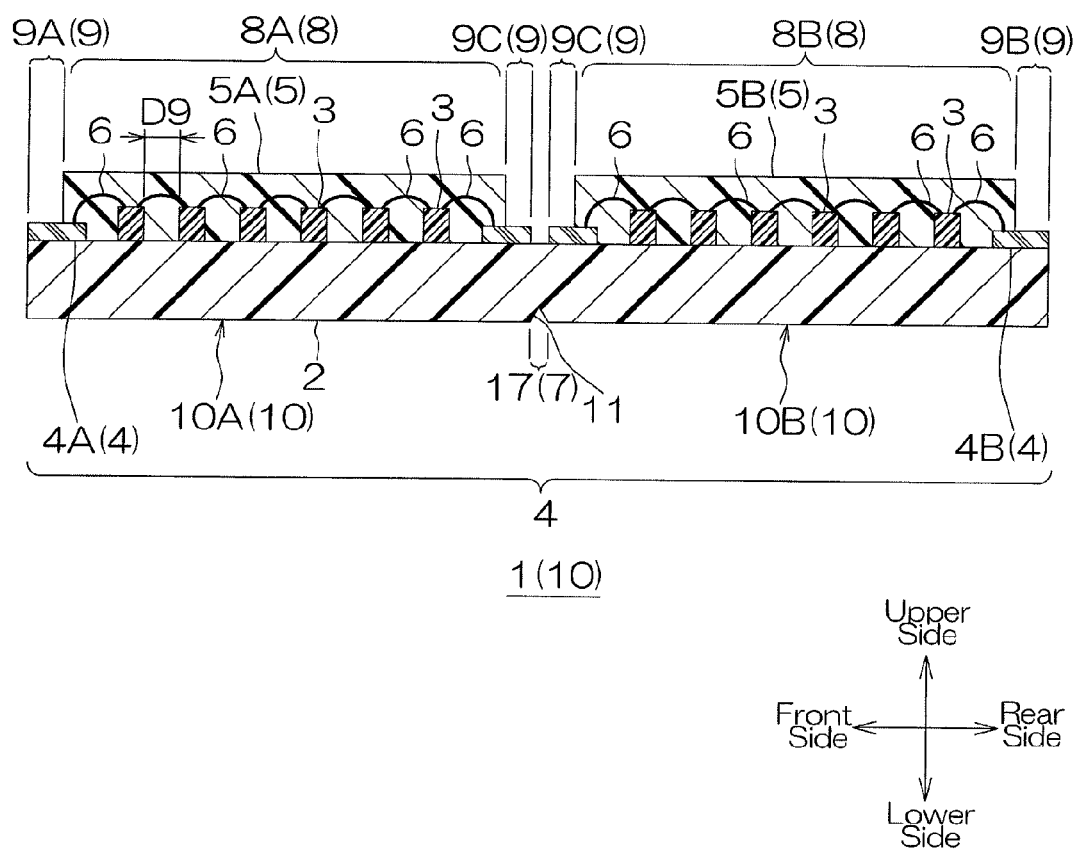
FIG. 9 shows an enlarged cross-sectional view along line C-C of light-emitting device assembly shown in FIG. 8.

In FIGS. 8 and 9, the members that are the same with those of the first embodiment are given with the same reference numbers, and detailed descriptions thereof are omitted.

As shown in FIGS. 8 and 9, the LEDs 3 and the wire 6 arranged in series can also be formed into a generally linear form along the front-rear directions.

In each of the light-emitting devices 10, the LEDs 3 that are arranged in series in the front-rear directions are provided in a plural number (e.g., 5 columns) in spaced-apart relation in the width direction.

The Second Embodiment also achieves the same operations and effects as those of the first embodiment.

Meanwhile, in the first embodiment, as shown in FIGS. 1 and 2, the LEDs 3 are arranged in a zigzag manner, to be specific, and the LEDs 3X in the left column are disposed at shifted positions when projected in the left-right directions relative to the LEDs 3Y in the right column. Thus, in the first embodiment, as shown in FIG. 8, compared with the second embodiment in which the LEDs 3 are arranged along the front-rear directions and the left-right directions, thermal load per LED 3 can be reduced, that is, heat-releasing characteristics from the LEDs 3 can be improved. Thus, the first embodiment is a preferable embodiment compared with the second embodiment.

<Modification>

In the second embodiment, as shown in FIG. 8, in each of the light-emitting devices 10, the LEDs 3 arranged in series in the front-rear directions are provided in a plural number (e.g., 5 columns), but for example, although not shown, the LEDs 3 arranged in series in the front-rear directions can be provided in a minimum column, to be specific, one column.

Third Embodiment

Figure 10:
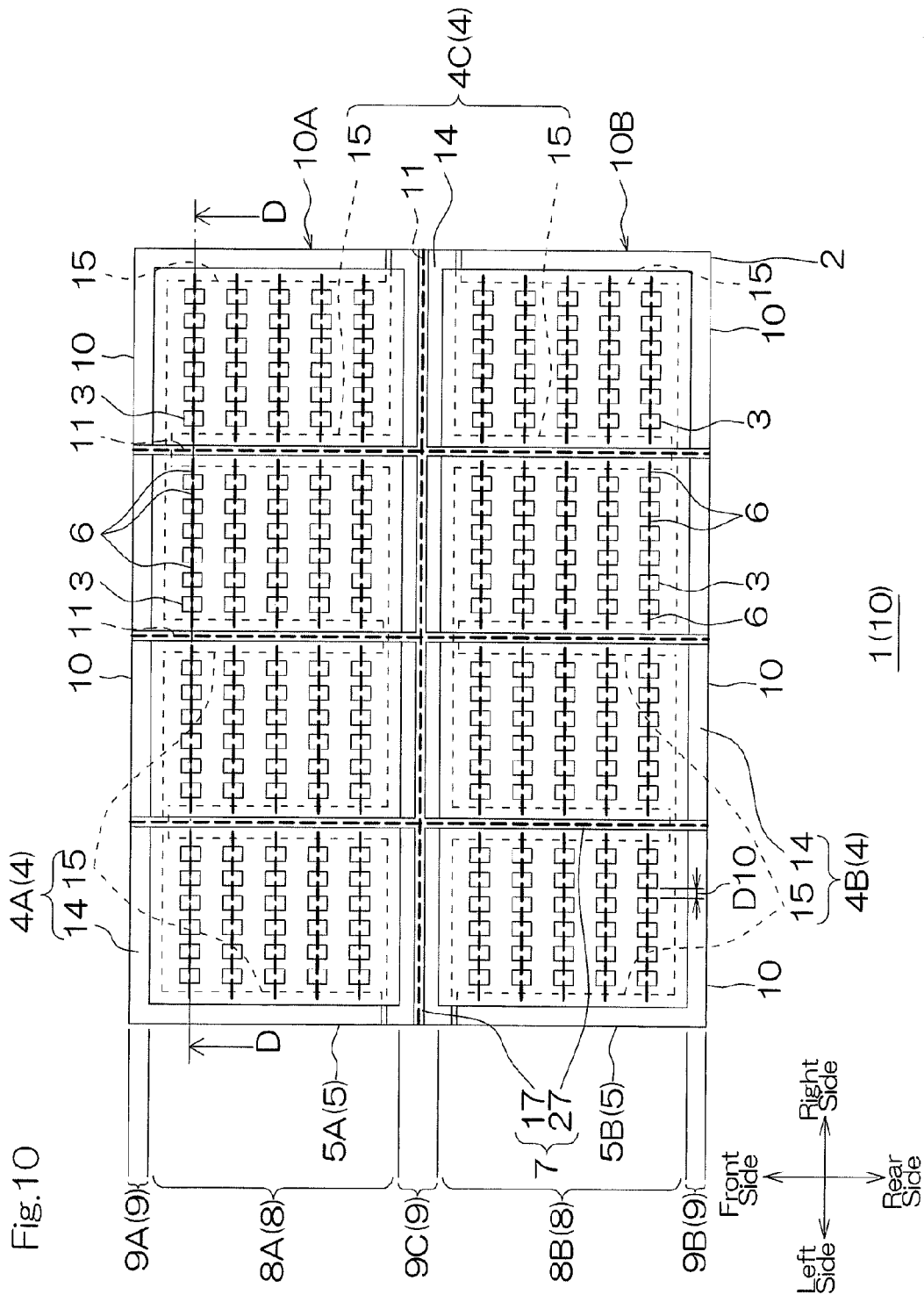
FIG. 10 shows a plan view of a third embodiment of the light-emitting device assembly of the present invention.

In FIGS. 10 and 11, the members that are the same with those of the first embodiment and the second embodiment are given with the same reference numbers, and detailed descriptions are omitted.

In the first embodiment and the second embodiment, as shown in FIGS. 1 and 8, the electrode 4 is formed into a generally rectangular shape extending in the left-right directions when viewed from the top (or generally straight line shape when viewed from the top), but in the third embodiment, the electrode 4 can also be formed into a generally comb shape when viewed from the top.

In the second embodiment, the arrangement in series made of the LEDs 3 and the wires 6 is formed along the front-rear directions, but in the third embodiment, these arrangement in series can be formed along the left-right directions.

As shown in FIGS. 10 and 11, in the each of the light-emitting devices 10, the LEDs 3 that are arranged in series along the left-right directions are arranged in series in a plural number (e.g., 5 rows) in the front-rear directions in spaced-apart relation.

Each of the electrodes 4A at the front-end portion and the electrodes 4C at the center portion in the left-right directions (portion corresponding to the light-emitting device 10A of the front row) is formed into a comb shape, and to be specific, integrally includes a base portion 14 extending in the left-right directions, and an extended portion 15 (thin broken line) extending from the base portion 14 in the front-rear directions. The electrode 4A at the front-end portion and the electrode 4C at the center portion in the front-rear directions are provided in the front-rear directions in spaced-apart relation. Then, the electrode 4A at the front-end portion and the electrode 4C at the center portion in the front-rear directions are disposed in a staggered manner. That is, the extended portions 15 are arranged so that they face each other in the left-right directions in spaced-apart relation, to be specific, the extended portion 15 of the electrode 4A at the front-end portion and the extended portion 15 of the electrode 4C at the center portion in the front-rear directions are disposed alternately in the left-right directions.

Each of the electrode 4B at the rear-end portion and the electrode 4C at the center portion in the front-rear directions (portion corresponding to the light-emitting device 10B of the rear row) is formed into a comb shape, and to be specific, integrally includes the base portion 14 extending in the left-right directions and the extended portion 15 (thin broken line) extending from the base portion 14 in the front-rear directions. The electrode 4B at the rear-end portion and the electrode 4C at the center portion in the front-rear directions are provided in the front-rear directions in spaced-apart relation. The electrode 4B at the rear-end portion and the electrode 4C at the center portion in the front-rear directions are disposed in a staggered manner. That is, the extended portions 15 are disposed so that they face each other in the left-right directions in spaced-apart relation, to be specific, the extended portion 15 of the electrode 4B at the rear-end portion and the extended portion 15 of the electrode 4C at the center portion in the front-rear directions are disposed alternately in the left-right directions.

The each of the extended portion 15 is formed so as to be divided into two in the left-right directions by the vertical fragile region 27. The base portion 14 is formed so as to be divided into two by the horizontal fragile region 17 in the front-rear directions.

Then, in each of the light-emitting devices 10, the rightmost LED 3 and the leftmost LED 3 are connected through the wire 6 to the extended portion 15 of the electrode 4 (to be specific, the electrode 4A at the front-end portion or the electrode 4B at the rear-end portion).

Third embodiment also achieves the same operations and effects of the first embodiment and the second embodiment.

Meanwhile, in the third embodiment, as shown in FIG. 10, the electrode 4 is formed into a generally comb shape when viewed from the top including the extended portion 15, and thus compared with the first embodiment and the second embodiment, in which the electrode 4 does not include the above-described extended portion 15 and is formed into a generally straight line when viewed from the top as shown in FIG. 1 and FIG. 8, the space for mounting the LEDs 3 is small, and the distance (interval) between the LEDs 3 in each row is formed to be short.

Thus, the first embodiment and the second embodiment are preferable embodiments compared with the third embodiment because their LEDs 3 are excellent in heat-releasing characteristics.

<Modification>

In the third embodiment, in each of the light-emitting devices 10, as shown in FIG. 10, the LEDs 3 that are arranged in series in the left-right directions are provided in a plural number (e.g., 5 rows), but for example, although not shown, the row can also be provided in the minimum row, to be specific, one row.

Fourth Embodiment

Figure 13:
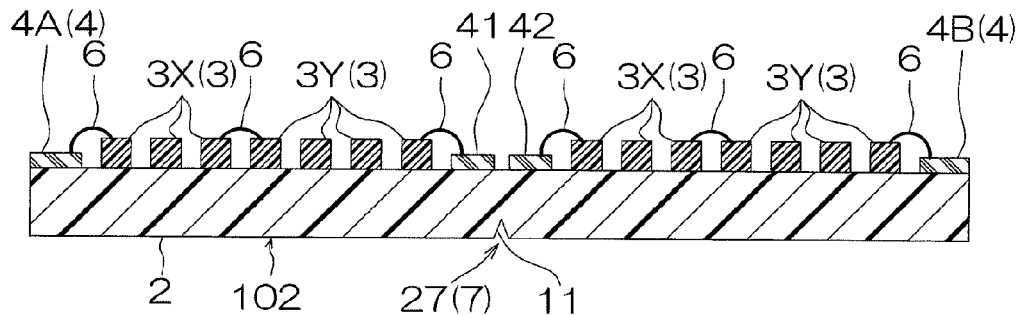
FIG. 13 shows, subsequent to FIG. 12, cross-sectional views illustrating a method for producing a light-emitting device assembly, i.e., a fourth embodiment of a light-emitting device assembly of the present invention, FIG. 13 (e) illustrating a step of electrically connecting electrodes, and electrically connecting electrodes and optical semiconductor element by wires, FIG. 13 (f) illustrating a step of encapsulating the optical semiconductor elements and the wires with the encapsulating layer, and FIG. 13 (g) illustrating a step of singulation of the light-emitting device assembly into light-emitting devices.
Figure 13:
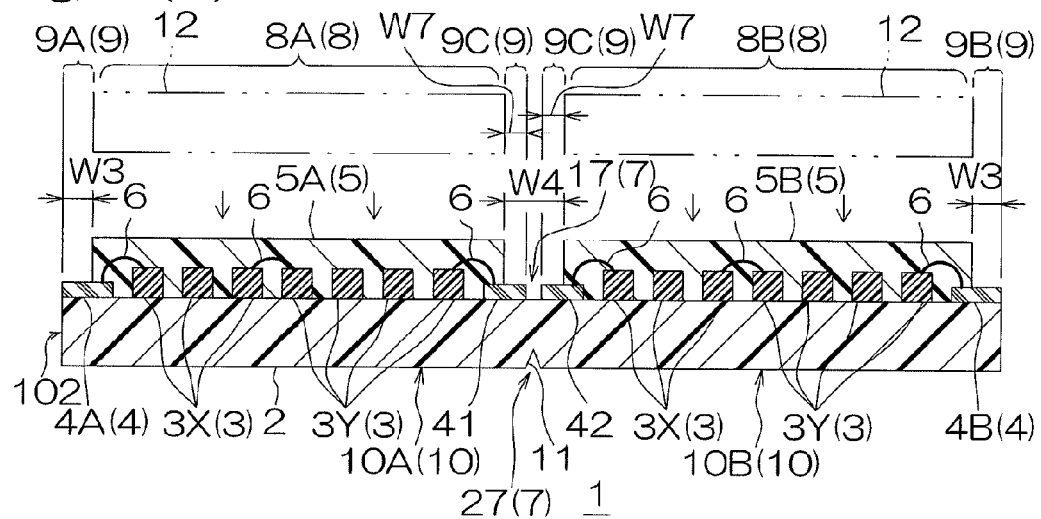
Figure 13:
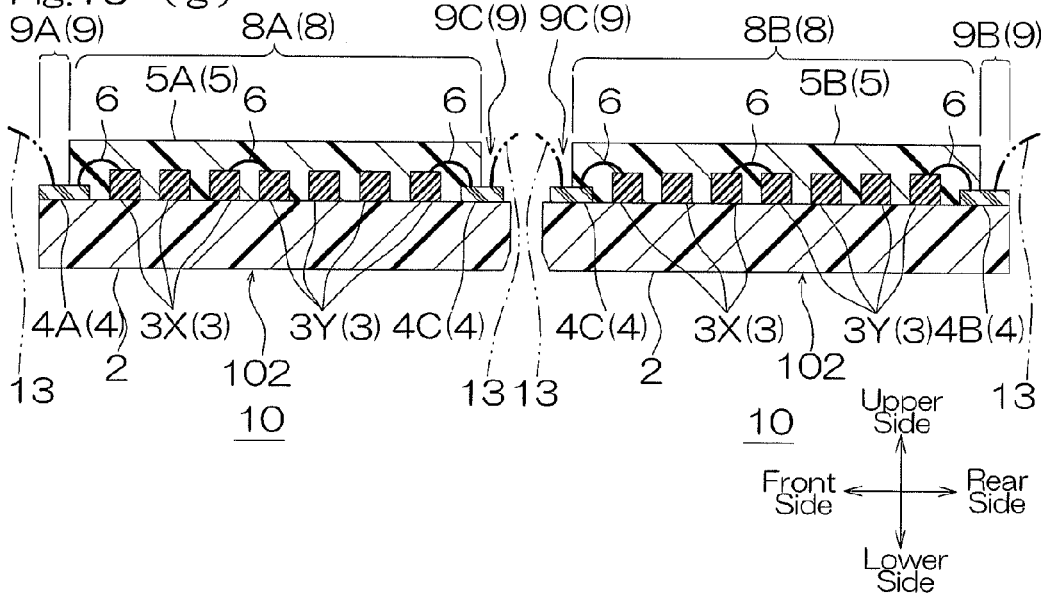

In FIGS. 12 and 13, the members that are the same with those of the first embodiment to third embodiment are given with the same reference numbers, and detailed descriptions thereof are omitted.

In the first embodiment, as shown in FIGS. 4 and 5, first, the LEDs 3 and the encapsulating layer 5 are formed sequentially, and thereafter, the cuts 11 are formed on the substrate 2. However, for example, as shown in FIGS. 12 and 13, first, the cuts 11 are formed on the substrate 2, and thereafter, the LEDs 3 and the encapsulating layer 5 can be formed sequentially.

First, as shown in FIG. 12 (a), a substrate 2 is prepared.

Then, as shown in FIG. 12 (b), electrodes 4 are formed on the substrate 2.

Then, as shown in FIG. 12 (c), cuts 11 are formed on the substrate 2 on which the electrodes 4 are formed.

In this manner, an electrode-bearing substrate 102 including the electrodes 4 and the substrate 2 having the cuts 11 formed therein is produced.

In the substrate 2 of the electrode-bearing substrate 102, a region for mounting the LEDs 3 (ref: FIG. 12 (d)) is formed as an element-mounting region, and a region for forming an encapsulating layer 5 (ref: FIG. 13 (f)) is formed so as to encapsulate the LEDs 3 as an encapsulating layer-forming region.

Then, as shown in FIG. 12 (d), the LEDs 3 are mounted on the element-mounting region of the substrate 2.

Then, as shown in FIG. 13 (e), the plurality of LEDs 3 and the LEDs 3 and the electrodes 4 are electrically connected through the wires 6.

Then, as shown in FIG. 13 (f), the encapsulating layer 5 is formed on the encapsulating layer-forming region of the substrate 2.

In this manner, a light-emitting device assembly 1 including the electrode-bearing substrate 102, the LEDs 3, and the encapsulating layer 5 is produced.

Thereafter, as shown in FIG. 13 (g), the light-emitting device assembly 1 is cut along the cuts 11 of the electrode-bearing substrate 102. In this manner, a light-emitting device 10 corresponding to the electrode-bearing substrate 102, the LEDs 3, and the encapsulating layer 5, and including these is produced.

In the electrode-bearing substrate 102, the LEDs 3 are mounted on the element-mounting region of the substrate 2, and the encapsulating layer 5 is formed on the encapsulating layer-forming region so as to encapsulate the LEDs 3: the cuts 11 that partition each of the plurality of light-emitting devices 10 corresponding to the LEDs 3 and the encapsulating layer 5 are formed, and thus the plurality of light-emitting devices 10 can be easily obtained by cutting the electrode-bearing substrate 102 along the cuts 11.

While the illustrative embodiments of the present invention are provided in the above description, such is for illustrative purpose only and it is not to be construed as limiting the scope of the present invention. Modifications and variations of the present invention that will be obvious to those skilled in the art are to be covered by the following claims.

What is claimed is:

1. A light-emitting device assembly comprising:
light-emitting devices being provided continuously,
the light-emitting device each including a substrate, a light-emitting diode mounted on a surface of the substrate, an encapsulating layer formed on the surface of the substrate to encapsulate the light-emitting diode, and an electrode formed on the surface of the substrate so as to be electrically connected to the light-emitting diode,
wherein the substrate has a fragile region formed to partition off the light-emitting devices that are disposed next to each other,
the fragile region having a weak mechanical strength compared to the substrate,
an encapsulating region that overlaps the light-emitting diode and the encapsulating layer as viewed from a thickness direction of the substrate, and
an electrode region that overlaps the electrode exposed from the encapsulating layer as viewed from the thickness direction, and
wherein the substrate is only divided into the fragile region, the encapsulating region, and the electrode region,
wherein the encapsulating layer includes a continuous region that allows for continuous encapsulation of the light-emitting devices that are disposed next to each other, and
the fragile region is formed so as to partition off the light-emitting devices that are disposed next to each other in the continuous region.

2. The light-emitting device assembly according to claim 1, wherein the fragile region is formed with cuts.

3. The light-emitting device assembly according to claim 1, wherein the encapsulating layer encapsulates the light-emitting devices that are disposed next to each other with a spaced-apart region interposed therebetween, and the fragile region is formed in the spaced-apart region.

* * * * *